US012143070B2

(12) United States Patent
Hu

(10) Patent No.: US 12,143,070 B2
(45) Date of Patent: Nov. 12, 2024

(54) PARALLEL INPUT AND DYNAMIC CASCADED OPERATIONAL TRANSCONDUCTANCE AMPLIFIER ACHIEVING HIGH PRECISION WITH PHASE SHIFTING

(71) Applicant: Richtek Technology Corporation, Zhubei (TW)

(72) Inventor: Min-Hung Hu, New Taipei (TW)

(73) Assignee: RICHTEK TECHNOLOGY CORPORATION, Zhubei (TW)

( * ) Notice: Subject to any disclaimer, the term of this patent is extended or adjusted under 35 U.S.C. 154(b) by 412 days.

(21) Appl. No.: 17/552,310

(22) Filed: Dec. 15, 2021

(65) Prior Publication Data
US 2022/0190788 A1 Jun. 16, 2022

(30) Foreign Application Priority Data
Dec. 16, 2020 (TW) .................. 109144431

(51) Int. Cl.
*H03F 1/42* (2006.01)
*H02M 3/155* (2006.01)
*H03F 3/45* (2006.01)

(52) U.S. Cl.
CPC ............. *H03F 1/42* (2013.01); *H02M 3/155* (2013.01); *H03F 3/45076* (2013.01); *H03F 2200/36* (2013.01)

(58) Field of Classification Search
CPC . H03F 1/00; H03F 1/02; H03F 1/0205; H03F 1/0211; H03F 1/0216; H03F 1/34;

(Continued)

(56) References Cited

U.S. PATENT DOCUMENTS 8,289,009 B1* 10/2012 Strik ....................... G05F 1/575
323/280
2006/0055383 A1* 3/2006 Eberlein .................. G05F 1/575
323/280

(Continued)

OTHER PUBLICATIONS

"Adaptive Biasing CMOS Amplifiers", by M. G. Degrauwe, published on IEEE Journal of Solid-State Circuits, vol. SC-17 No. 3, pp. 522-528, Jun. 1982.

(Continued)

*Primary Examiner* — Thienvu V Tran
*Assistant Examiner* — Carlos O Rivera-Perez
(74) *Attorney, Agent, or Firm* — Tung & Associates

(57) ABSTRACT

A parallel input and dynamic cascaded OTA (operational transconductance amplifier includes: plural sub-OTAs which generate corresponding plural transconductance output currents according to corresponding plural differential input voltages; and at least one cascading capacitor which is cascaded between a first sub-OTA and a second sub-OTA. A second transconductance output current generated by the second sub-OTA is coupled through the cascading capacitor to generate a transient bias current on a common mode bias node of the first sub-OTA, thus providing the transient bias current to a differential pair circuit of the first sub-OTA in a case when a transient variation occurs in the differential input voltage corresponding to the first sub-OTA, so that a loop bandwidth and a response speed during a transient state are enhanced.

18 Claims, 21 Drawing Sheets

(58) Field of Classification Search
CPC ........ H03F 1/342; H03F 1/42; H03F 2200/36;
H03F 2200/54; H03F 2200/129; H03F
2200/27; H03F 2203/45; H03F
2203/45051; H03F 2203/45116; H03F
3/45; H03F 3/45071; H03F 3/4508; H03F
3/45085; H03F 3/45076; H03F 3/45475;
H03F 3/45183; H03F 3/68; H02M 3/155;
H02M 3/156; H02M 3/1566; G05F 1/56;
G05F 1/561; G05F 1/563; G05F 1/565;
G05F 1/575
USPC ................ 323/223–226, 266, 268–275, 280,
323/282–285, 304, 311–317, 351;
330/98–100, 123, 252, 261, 267, 273,
330/285, 291, 294, 296
See application file for complete search history.

(56) References Cited

U.S. PATENT DOCUMENTS

2010/0134190 A1    6/2010  Ballarin et al.
2019/0079551 A1*  3/2019  Tourret .................. G05F 1/575

OTHER PUBLICATIONS

"A Very-High-Slew-Rate CMOS Operational Amplifier", by R. Klinke, published on IEEE Journal of Solid-State Circuits, vol. 24, No. 3, pp. 744-746, Jun. 1989.

* cited by examiner

PARALLEL INPUT AND DYNAMIC CASCADED OPERATIONAL TRANSCONDUCTANCE AMPLIFIER ACHIEVING HIGH PRECISION WITH PHASE SHIFTING

CROSS REFERENCE

The present invention claims priority to TW 109144431 filed on Dec. 16, 2020.

BACKGROUND OF THE INVENTION

Field of Invention

The present invention relates to an operational transconductance amplifier (OTA); particularly, it relates to a parallel input and dynamic cascaded operational transconductance OTA capable of achieving high precision via phase shifting. The present invention also relates to a regulator circuit employing such OTA.

Description of Related Art

The following prior arts are relevant to the present invention: "Adaptive Biasing CMOS Amplifiers", by M. G. Degrauwe, published on IEEE Journal of Solid-State Circuits, Vol. SC-17 No. 3, pp. 522-528, June 1982 (as shown in FIG. 1A and FIG. 1B) and "A Very-High-Slew-Rate CMOS Operational Amplifier", by R. Klinke, published on IEEE Journal of Solid-State Circuits, Vol. 24, No. 3, pp. 744-746, June 1989 (as shown in FIG. 1C).

Please refer to FIG. 1A, which show a schematic diagram of a conventional operational transconductance amplifier 101A. This operational transconductance amplifier 101A is equipped with two differential amplification pairs 91 and 92. In a case when there is a differential input voltage Vd between two differential input ends Vip and Vin, the transconductance operational amplifier 101A can supply an additional current to increase a common mode bias current Icb of a major differential amplification pair 93 in a transient state, so as to enhance the loop bandwidth and the response speed during the transient state; during a steady state, the common mode bias current Icb is reduced, so as to enhance stability through reducing the loop bandwidth.

Please refer to FIG. 1B, which show a schematic diagram of a conventional operational transconductance amplifier 101B. In a case when there is a differential input voltage Vd between two differential input ends Vip and Vin, the transconductance operational amplifier 101B can supply an additional current via a mirrored current of a major differential amplification pair 94, to increase a common mode bias current Icb of a major differential amplification pair 93 in a transient state, so as to enhance the loop bandwidth and the response speed during the transient state; during a steady state, the common mode bias current Icb is reduced, so as to enhance stability through reducing the loop bandwidth.

The prior arts shown in FIG. 1A and FIG. 1B have the following drawbacks that: the operational transconductance amplifier 101A and the operational transconductance amplifier 101B can only supply a limited additional current. Besides, when the additional current is generated, these prior arts suffer an issue of slow response speed due to the number of current mirrors, causing the supplied current not to be timely provided and is insufficient to enhance the loop bandwidth.

Please refer to FIG. 1C, which show a schematic diagram of a conventional operational transconductance amplifier 101C. The operational transconductance amplifier 101C shown in FIG. 1C is similar to the operational transconductance amplifier 101A shown in FIG. 1A, but is different in that: in addition to supplying additional current via two groups of differential amplification pairs 91 and 92, the operational transconductance amplifier 101C can supply an additional current further via an amplification transistor pair MA1 and MA2 having a gain, to increase the common mode bias current Icb of the major differential amplification pair 93 in a transient state, so as to enhance the loop bandwidth and the response speed during the transient state; during a steady state, the common mode bias current Icb is reduced, so as to enhance stability through reducing the loop bandwidth.

The prior art shown in FIG. 1C has the following drawback that: although the common mode bias current Icb can be increased by the gain stage, the existence of a gain stage will introduce a additional stability issue.

As compared to the prior art in FIG. 1A and FIG. 1B, the present invention is advantageous in that: the operational transconductance amplifier of the present invention can significantly increase the common mode bias current of the major differential amplification pair, thus increasing the loop bandwidth and the response speed during the transient state. As compared to the prior art in FIG. 1C, the present invention is advantageous in that: in addition to significantly increasing the common mode bias current of the major differential amplification pair to increase the loop bandwidth and the response speed during the transient state, the transconductance amplifier of the present invention further enhances stability.

SUMMARY OF THE INVENTION

From one perspective, the present invention provides a parallel input and dynamic cascaded operational transconductance amplifier (OTA), comprising: a plurality of sub-OTAs, wherein each sub-OTA is configured to operably generate a corresponding transconductance output current according to a corresponding differential input voltage, wherein the plurality of sub-OTAs sub-OTA include a first sub-OTA and a second sub-OTA; and at least one cascading capacitor, which is cascaded between the first sub-OTA and the second sub-OTA, wherein the at least one cascading capacitor includes a first cascading capacitor, which is cascaded between the first sub-OTA and the second sub-OTA; wherein a second transconductance output current generated by the second sub-OTA is coupled through the first cascading capacitor to generate a transient bias current on a common mode bias node of the first sub-OTA, thus providing the transient bias current to a differential pair circuit of the first sub-OTA in a case when a transient variation occurs in the differential input voltage corresponding to the first sub-OTA, so that a loop bandwidth and a response speed during the transient state are enhanced, and during a steady state, the transient bias current is reduced, so as to enhance stability through reducing the loop bandwidth; wherein the differential input voltage corresponding to the first sub-OTA is correlated with the differential input voltage corresponding to the second sub-OTA.

In one embodiment, a pair of differential input ends of the first sub-OTA are connected in parallel with a pair of differential input ends of the second sub-OTA.

In one embodiment, a transconductance coefficient of the second sub-OTA is greater than a transconductance coefficient of the first sub-OTA.

In one embodiment, the parallel input and dynamic cascaded OTA further comprises: a direct current (DC) bias voltage load, which is coupled to an output end of the second sub-OTA and which is coupled to the first cascading capacitor, wherein the DC bias voltage load is configured to operably receive the second transconductance output current, so as to provide a corresponding DC bias voltage at the output end of the second sub-OTA.

In one embodiment, the DC bias voltage load includes a metal oxide semiconductor (MOS) diode.

In one embodiment, each sub-OTA is configured as an OTA having a pair of differential input ends and a single output end, wherein an impedance of the DC bias voltage load corresponding to the second sub-OTA is large to an extent such that the first cascading capacitor generates a pole having a low frequency at the common mode bias node of the first sub-OTA, thus causing two transconductance currents generated by the first sub-OTA to have a phase difference in between, wherein the phase difference is large to an extent such that under an unit gain bandwidth, the parallel input and dynamic cascaded OTA has a phase margin greater than or equal to 45 degree.

In one embodiment, the first cascading capacitor is configured to operably generate a zero preceding an unit gain bandwidth of the first sub-OTA, such that under the unit gain bandwidth, the parallel input and dynamic cascaded OTA has a phase margin greater than or equal to 45 degree.

In one embodiment, one of the plurality of sub-OTAs is configured as one of the following: (1) an OTA having single-stage differential input ends and a single output end, wherein the transconductance amplifier having the single-stage differential input ends and the single output end includes: an in-phase differential transistor and a reversed-phase differential transistor, wherein the in-phase differential transistor is configured to operably generate an in-phase transconductance current according to the corresponding differential input voltage, whereas, the reversed-phase differential transistor is configured to operably generate a reversed-phase transconductance current according to the corresponding differential input voltage; wherein the in-phase differential transistor is coupled to a MOS diode; or (2) an OTA having balance differential input ends and a single output end, wherein the transconductance amplifier having the balance differential input ends and the single output end includes: an in-phase differential transistor and a reversed-phase differential transistor, wherein the in-phase differential transistor is configured to operably generate an in-phase transconductance current according to the corresponding differential input voltage, whereas, the reversed-phase differential transistor is configured to operably generate a reversed-phase transconductance current according to the corresponding differential input voltage; wherein the in-phase differential transistor is coupled to a corresponding MOS diode, whereas, the reversed-phase differential transistor is coupled to another corresponding MOS diode; or (3) an OTA having folded cascaded differential input ends and a single output end, wherein the transconductance amplifier having the folded cascaded differential input ends and the single output end includes: an in-phase differential transistor, a reversed-phase differential transistor and a cascaded current mirror circuit, which are configured to operably generate an in-phase transconductance current and a reversed-phase transconductance current according to the corresponding differential input voltage; wherein the in-phase differential transistor is coupled to a corresponding cascaded node of the cascaded current mirror circuit, whereas, the reversed-phase differential transistor is coupled to another corresponding cascaded node of the cascaded current mirror circuit.

In one embodiment, each sub-OTA includes: a current source circuit which is configured to be operably coupled to the in-phase differential transistor and the reversed-phase differential transistor, wherein the common mode bias node corresponds to one of the following: (1) the common mode bias node is a coupling node among the current source circuit, the in-phase differential transistor and the reversed-phase differential transistor; or (2) the common mode bias node is a control end of the current source circuit; or (3) the common mode bias node is a cascaded node of the current source circuit, wherein the current source circuit is configured as a cascaded current source circuit.

In one embodiment, the first sub-OTA is configured to operably receive another transient bias current on another common mode bias node of the first sub-OTA via another cascading capacitor, thus providing the another transient bias current to the differential pair circuit of the first sub-OTA in a case when a transient variation occurs in the differential input voltage corresponding to the first sub-OTA, so that the loop bandwidth and the response speed during the transient state are enhanced and during the steady state, the another transient bias current is reduced, so as to enhance stability through reducing the loop bandwidth; wherein the another transient bias current is generated according to one of the following configurations: (1) the second sub-OTA is further configured to operably generate the another transient bias current; or (2) the plurality of sub-OTAs further include: a third sub-OTA, wherein a third transconductance output current generated by the third sub-OTA is coupled through the another cascading capacitor to generate the another transient bias current on the another common mode bias node of the first sub-OTA; wherein the differential input voltage corresponding to the first sub-OTA is correlated with the differential input voltage corresponding to the third sub-OTA.

In one embodiment, the first sub-OTA further includes a current source circuit, which is coupled to the differential pair circuit of the first sub-OTA, wherein the common mode bias node is to a coupling node between the current source circuit and the differential pair circuit, whereas, the another common mode bias node is to a cascaded node of the current source circuit, wherein the current source circuit is configured as a cascaded current source circuit.

In one embodiment, the first sub-OTA is further configured to operably receive another transient bias current on the common mode bias node of the first sub-OTA via another cascading capacitor, thus providing the another transient bias current to the differential pair circuit of the first sub-OTA in a case when a transient variation occurs in the differential input voltage corresponding to the first sub-OTA, so that the loop bandwidth and the response speed during the transient state are enhanced and during the steady state, the another transient bias current is reduced, so as to enhance stability through reducing the loop bandwidth; wherein the another transient bias current is generated according to one of the following configurations: (1) the second sub-OTA is further configured to operably generate the another transient bias current; or (2) the plurality of sub-OTAs further include: a third sub-OTA, wherein a third transconductance output current generated by the third sub-OTA is coupled through the another cascading capacitor to generate the another transient bias current on the common mode bias node of the first sub-OTA; wherein the differential input voltage corresponding to the first sub-OTA is correlated with the differential input voltage corresponding to the third sub-OTA.

In one embodiment, the first sub-OTA further includes a current source circuit, which is coupled to the differential pair circuit of the first sub-OTA, wherein the common mode bias node is a coupling node between the current source circuit and the differential pair circuit, whereas, the first sub-OTA further includes another common mode bias node which is a cascaded node of the current source circuit, wherein the current source circuit is configured as a cascaded current source circuit; wherein the first sub-OTA is configured to operably receive another transient bias current on the another common mode bias node of the first sub-OTA via another cascading capacitor, thus providing the another transient bias current to the differential pair circuit of the first sub-OTA in a case when a transient variation occurs in the differential input voltage corresponding to the first sub-OTA, so that the loop bandwidth and the response speed during the transient state are enhanced and during the steady state, the another transient bias current is reduced, so as to enhance stability through reducing the loop bandwidth; wherein the another transient bias current is generated according to one of the following configurations: (1) the second sub-OTA is further configured to operably generate the another transient bias current; or (2) the plurality of sub-OTAs further include: a third sub-OTA, wherein a third transconductance output current generated by the third sub-OTA is coupled through the another cascading capacitor to generate the another transient bias current on the another common mode bias node of the first sub-OTA; wherein the differential input voltage corresponding to the first sub-OTA is correlated with the differential input voltage corresponding to the third sub-OTA.

From another perspective, the present invention provides a regulator circuit, comprising: the above-mentioned parallel input and dynamic cascaded OTA; an output transistor; and a feedback circuit; wherein one of the pair of differential input ends of the first sub-OTA is coupled to a first reference signal, whereas, another one of the pair of differential input ends of the first sub-OTA is configured to operably receive a feedback signal, so as to regulate an output signal to a target value, wherein the target value is correlated with the first reference signal; and wherein one of the pair of differential input ends of the second sub-OTA is coupled to a second reference signal, whereas, another one of the pair of differential input ends of the second sub-OTA is configured to operably receive the feedback signal; wherein a ratio of the second reference signal to the first reference signal is correlated with a feedback gain of the feedback circuit.

The objectives, technical details, features, and effects of the present invention will be better understood with regard to the detailed description of the embodiments below, with reference to the attached drawings.

DESCRIPTION OF THE PREFERRED EMBODIMENTS

The drawings as referred to throughout the description of the present invention are for illustration only, to show the interrelations between the circuits and the signal waveforms, but not drawn according to actual scale of circuit sizes and signal amplitudes and frequencies.

Figure 1A:
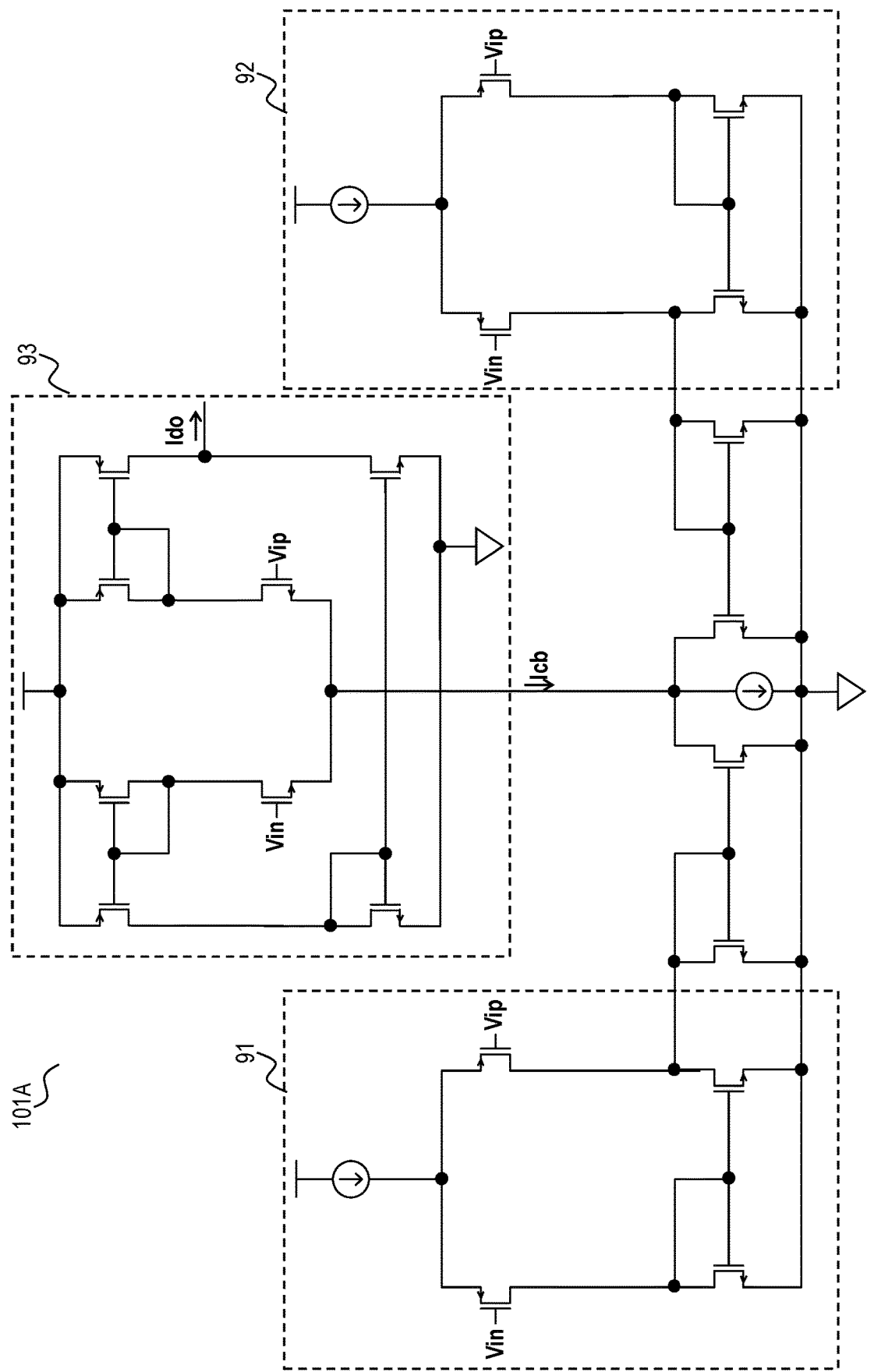
FIGS. 1A-1C show a schematic diagram of a conventional operational transconductance amplifier.
Figure 1B:
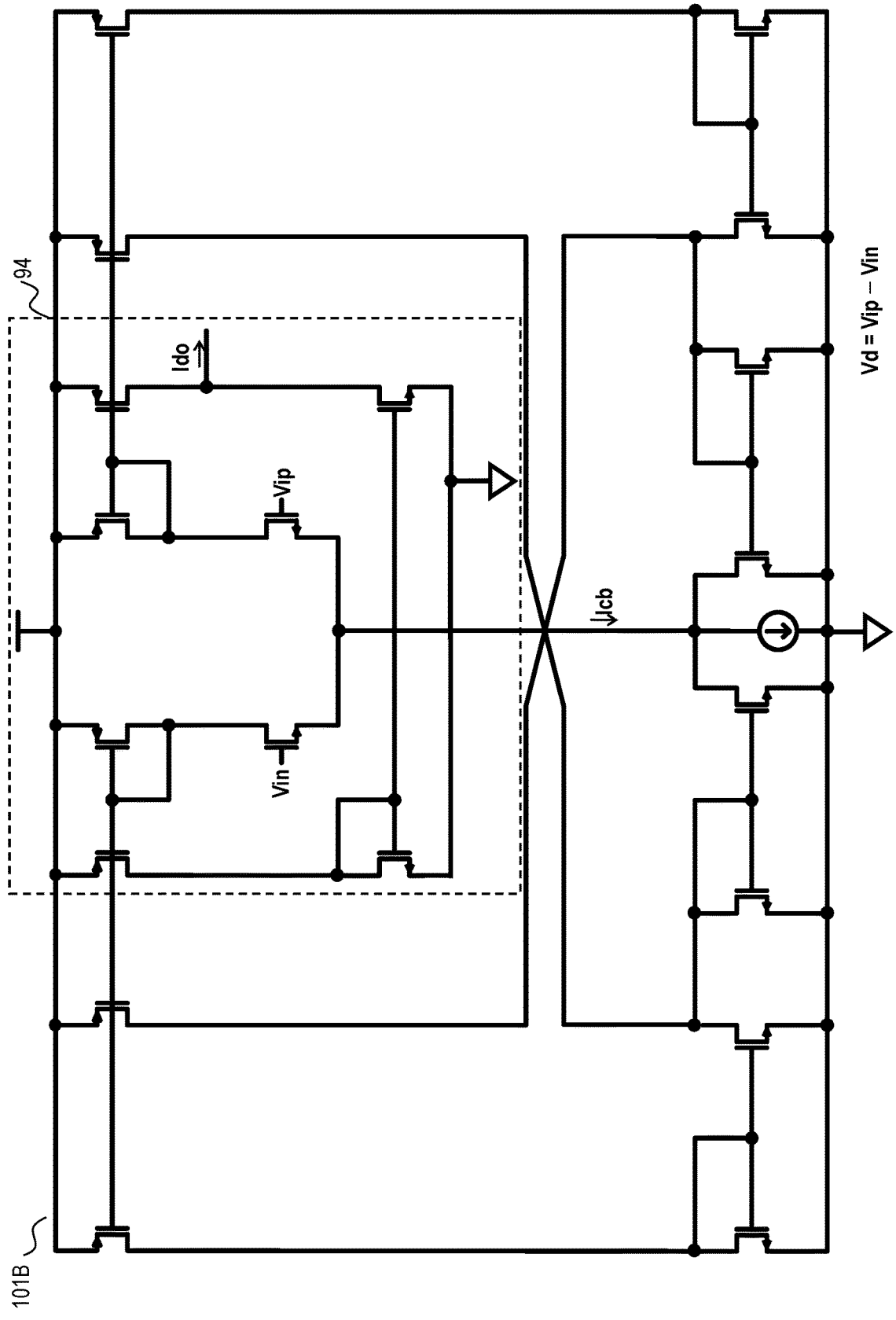
Figure 1C:
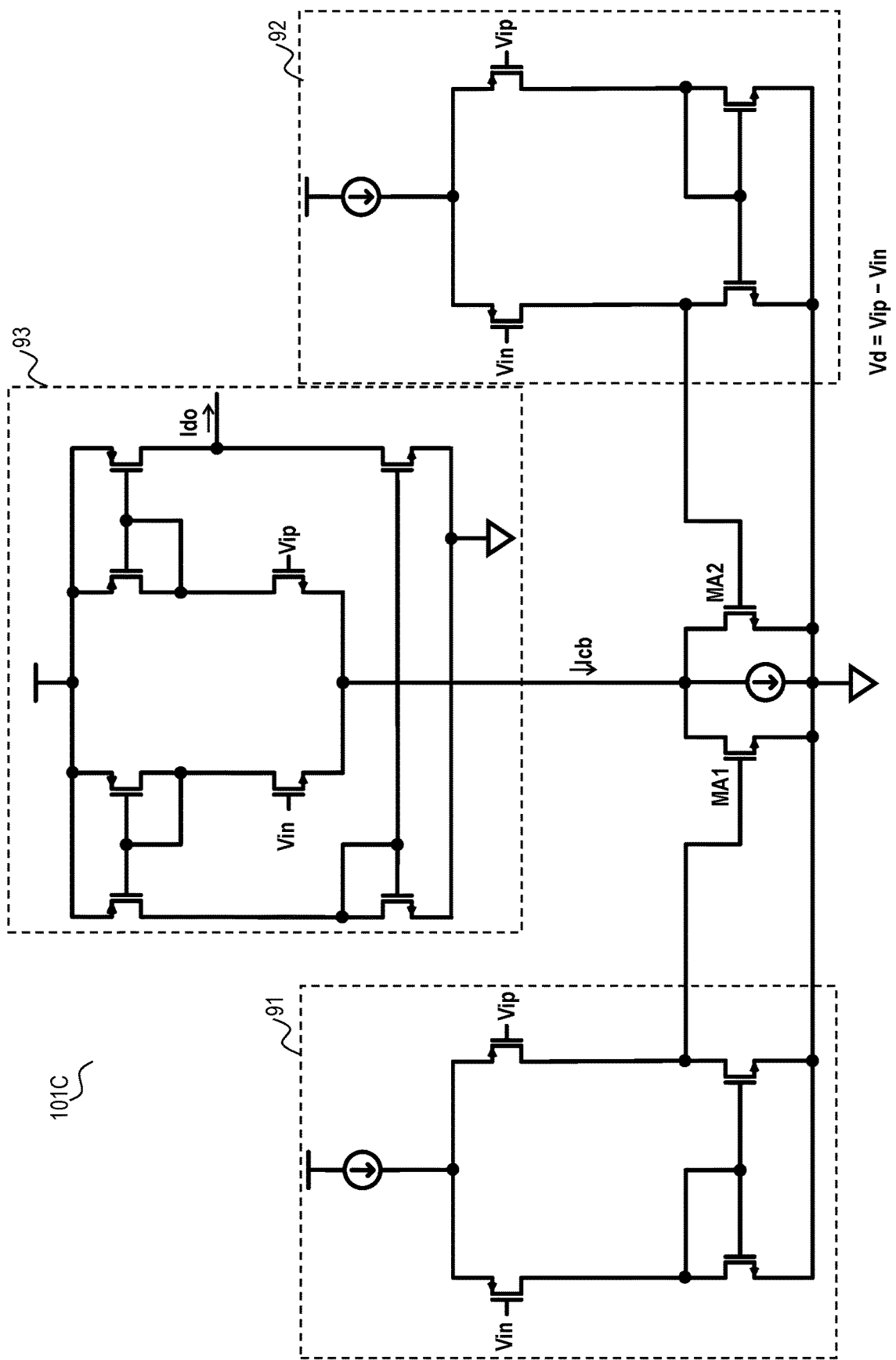
Figure 2A:
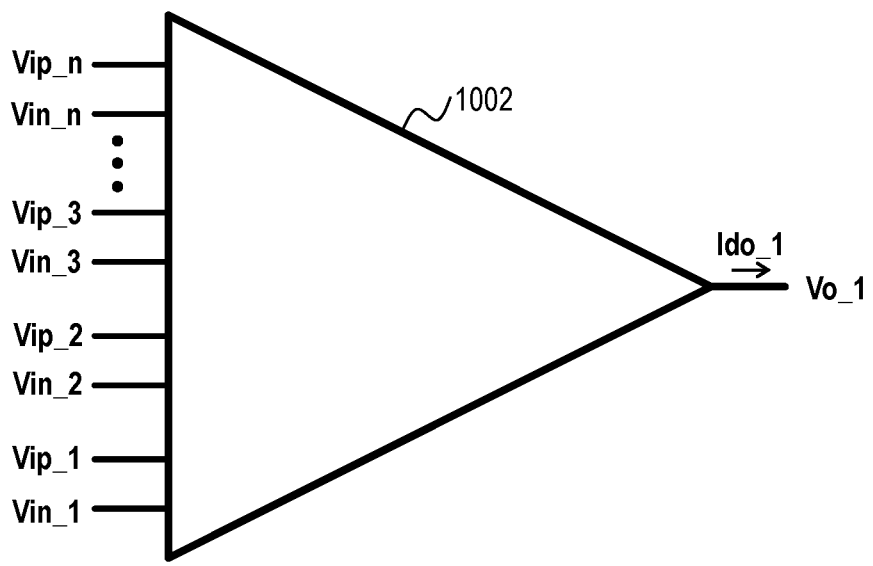
FIG. 2A and FIG. 2B show a schematic diagram of a parallel input and dynamic cascaded operational transconductance amplifier (OTA) according to an embodiment of the present invention.
Figure 2B:
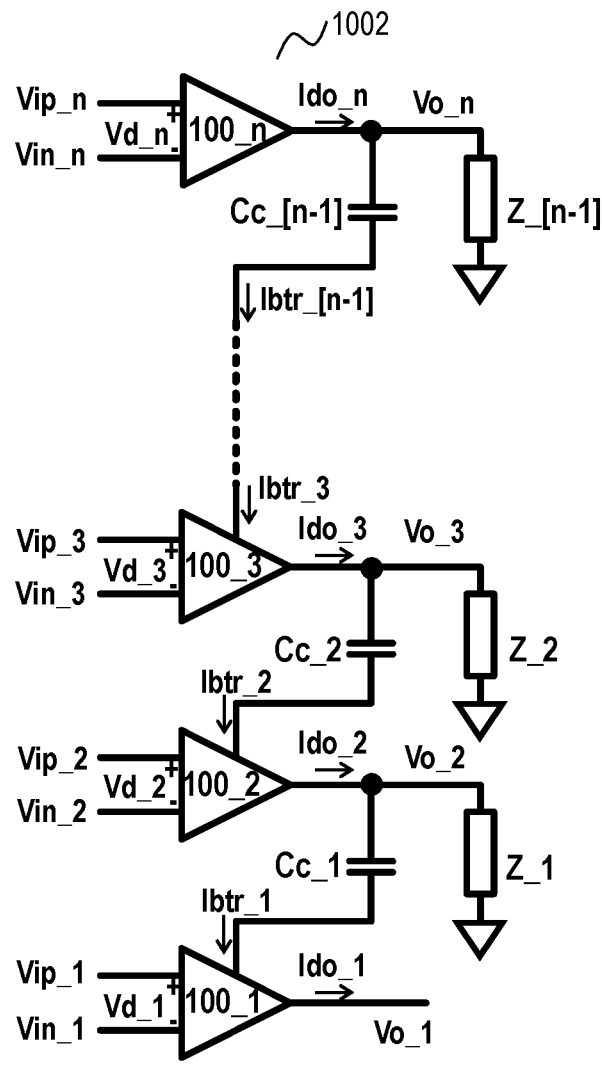

Please refer to FIG. 2A and FIG. 2B, which show a schematic diagram of a parallel input and dynamic cascaded operational transconductance amplifier (OTA) (i.e., parallel input and dynamic cascaded OTA 1002) according to an embodiment of the present invention. In one embodiment, as shown in FIG. 2A and FIG. 2B, the parallel input and dynamic cascaded OTA 1002 has plural pairs of differential input ends (Vip_1, Vin_1)~(Vip_n, Vin_n), wherein n is a positive integer greater than one. The parallel input and dynamic cascaded OTA 1002 is configured to operably generate an amplification output voltage Vo_1 and a transconductance output current Ido_1 according to corresponding differential input voltages Vd_1~Vd_n. The differential input voltages Vd_1~Vd_n correspond to corresponding voltage differences (i.e., Vd_1=Vip_1−in_1, . . . , Vd_n=Vip_n−Vin_n) between the pairs of differential input ends (Vip_1, Vin_1)~(Vip_n, Vin_n).

As shown in FIG. 2B, in this embodiment, the parallel input and dynamic cascaded OTA 1002 comprises: plural sub-OTAs 100_1~**100_*n*. Each sub-OTA 100_1~100_*n* has a corresponding transconductance coefficient gm_1~gm_n. In this embodiment, the amplification output voltage of the parallel input and dynamic cascaded OTA 1002 corresponds to an amplification output voltage Vo_1 of the sub-OTA 100_1**.

According to the present invention, in this embodiment, at least two sub-OTAs in the sub-OTAs 100_1~**100_*n* are cascaded to each other via a cascading capacitor. In the embodiment of FIG. 2B, the sub-OTA 100_1 and the sub- OTA 100_2 are cascaded to each other via a cascading capacitor Cc_1. A transconductance output current Ido_2 generated by the sub-OTA 100_2, via the cascading capacitor Cc_1, generates a transient bias current Ibtr_1 on a common mode bias node of the sub-OTA 100_1, and the transient bias current Ibtr_1 is provided to a differential pair circuit of the sub-OTA 100_1 in a case when there is a variation in the differential input voltage Vd_1 of the corresponding sub-OTA 100_1**, so as to enhance the loop bandwidth and the response speed during the transient state; during a steady state, the transient bias current Ibtr_1 is reduced, so as to enhance the stability through reducing the loop bandwidth.

From one perspective, in a case when a differential input voltage (e.g., Vd_1 or Vd_2) varies, the cascading capacitor Cc_1 is configured to operably feed an AC portion of the transconductance output current Ido_2 generated by the sub-OTA 100_2 to at least one common mode bias node of the sub-OTA 100_1, so as to generate the above-mentioned transient bias current (i.e., Ibtr_1).

Please still refer to FIG. 2B. In one embodiment, as shown in FIG. 2B, output ends of the upstream sub-OTAs (i.e., 100_2~100_n) are coupled to corresponding direct current (DC) bias voltage loads Z_1~Z_[n−1], respectively, wherein each DC bias voltage load Z_1~Z[n−1] is configured to operably determine a corresponding DC bias voltage (i.e., sub-output voltages Vo_2~Vo_n) at the output end of the corresponding upstream sub-OTA (i.e., 100_2~100_n) according to the corresponding transconductance output current Ido_2~Ido_n.

Figure 2C:
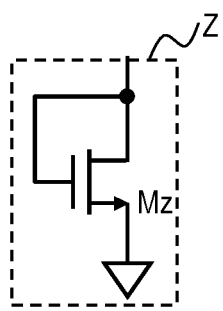
FIG. 2C shows a specific embodiment of a DC bias voltage load in a parallel input and dynamic cascaded OTA according to the present invention.

Please refer to FIG. 2C, which shows a specific embodiment of a DC bias voltage load. In one embodiment, as shown in FIG. 2C, a DC bias voltage load Z (corresponding to the above-mentioned DC bias voltage load Z_1~Z[n−1]) includes a metal oxide semiconductor (MOS) diode, which determines the above-mentioned DC bias voltage. In this embodiment, the MOS diode is a MOS transistor Mz which is coupled as a diode, wherein as shown in FIG. 2C, the source and the drain of the MOS transistor Mz are short-circuited to each other or are coupled in-phase to each other.

It is noteworthy that, in this embodiment, in a case when one differential input voltage changes, all differential input voltages of the plural sub-OTAs (i.e., 100_1~100_n) are all correlated with one another. In other words, for example, when the differential input voltage Vd_1 of the sub-OTA 100_1 changes, all differential input voltages (i.e., Vd_2~Vd_n) of the rest of the sub-OTAs (i.e., 100_2~100_n) also change accordingly. In one embodiment, when the differential input voltage Vd_1 of the sub-OTA 100_1 changes, all differential input voltages (i.e., Vd_2~Vd_n) of the rest of the sub-OTAs (i.e., 100_2~100_n) change in a positive correlation.

Figure 3A:
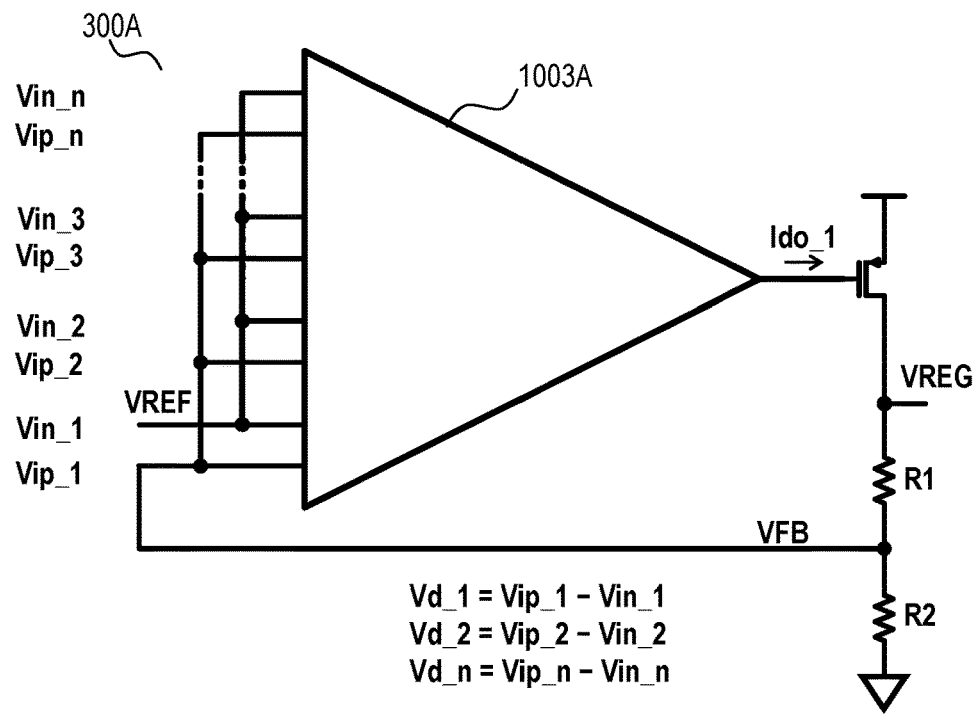
FIG. 3A and FIG. 3B show embodiments of a parallel input and dynamic cascaded OTA and a low dropout regulator (LDO).

Please refer to FIG. 3A, which shows an embodiment of a parallel input and dynamic cascaded OTA (i.e., parallel input and dynamic cascaded OTA 1003A) and a low dropout regulator (LDO) (i.e., LDO 300A). In one embodiment, as shown in FIG. 3A, all pairs of differential input ends (Vip_1, Vin_1)~(Vip_n, Vin_n) of the parallel input and dynamic cascaded OTA 1003A are connected in parallel with one another. To elaborate in more detail, in this embodiment, all of the in-phase differential input ends Vip_1~Vip_n are directly electrically connected with one another, whereas, all of the reversed-phase differential input ends Vin_1~Vin_n are directly electrically connected with one another. In other words, all of the differential input voltages Vd_1~Vd_n are identical.

In this embodiment, as shown in FIG. 3A, the parallel input and dynamic cascaded OTA 1003A is implemented as a LDO 300A having a gain A (wherein the gain A=1+R1/R2) via a negative feedback configuration. The LDO 300A is configured to operably generate a regulation output voltage VREG. In this LDO 300A, all of the in-phase differential input ends Vip_1~Vip_n are directly electrically connected to a reference voltage VREF, whereas, all of the reversed-phase differential input ends Vin_1~Vin_n are directly electrically connected to a feedback voltage VFB. Thus, when a transient voltage difference appears between the feedback voltage VFB and the reference voltage VREF due to for example a load change, the above-mentioned sub-OTAs 100_2~100_n can respectively generate the corresponding transient bias currents Ibtr_1~Ibtr[n−1] via the corresponding cascading capacitors Cc_1~Cc[n−1] according to the transient voltage difference between the feedback voltage VFB and the reference voltage VREF. The transient bias currents Ibtr_1~Ibtr[n−1] will be respectively supplied to the corresponding differential pair circuits in the corresponding the sub-OTAs 100_1~100[n−1], so as to enhance the loop bandwidth and the response speed during the transient state; during a steady state, the transient bias currents are reduced, so as to enhance the stability through reducing the loop bandwidth.

Figure 3B:
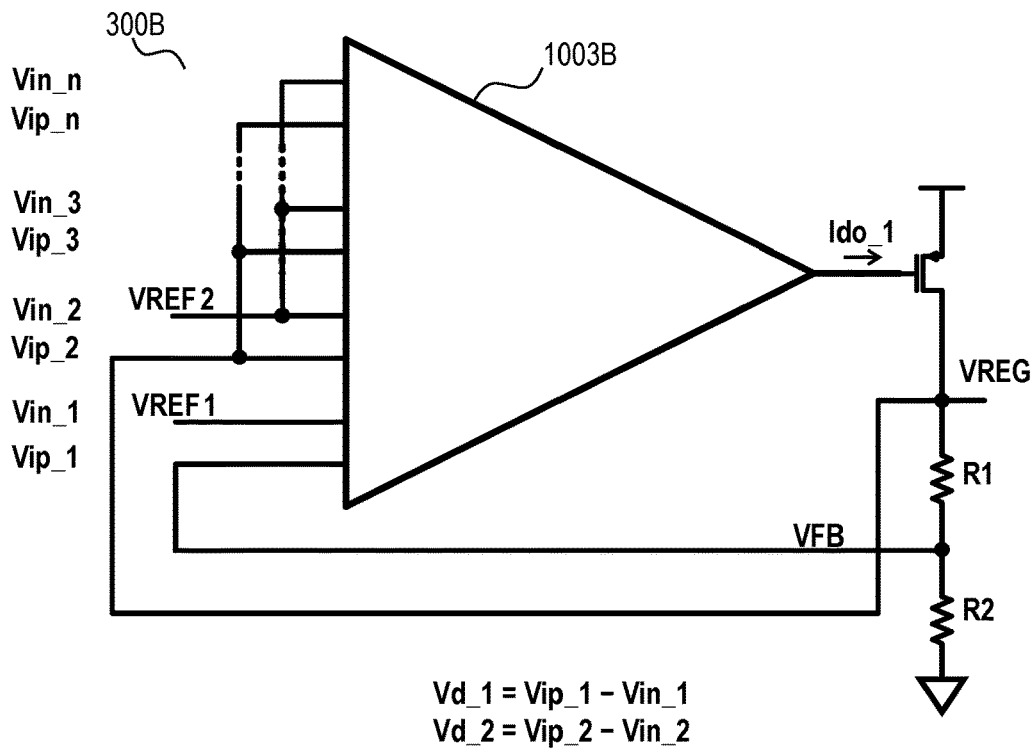

Please refer to FIG. 3B, which shows an embodiment of a parallel input and dynamic cascaded OTA (i.e., parallel input and dynamic cascaded OTA 1003B) and a low dropout regulator (LDO) (i.e., LDO 300B). The LDO 300B of this embodiment shown in FIG. 3B is similar to the LDO 300A of the embodiment shown in FIG. 3A, but is different in that: in this embodiment, the differential input voltage Vd_1 of the parallel input and dynamic cascaded OTA 1003B corresponds to a transient voltage difference between a reference voltage VREF1 and a feedback voltage VFB of the LDO 300B, whereas, the differential input voltages Vd_2~Vd_n of the parallel input and dynamic cascaded OTA 1003B correspond to a transient voltage difference between a reference voltage VREF2 and a regulation output voltage VREG of the LDO 300B. The relationship between the reference voltage VREF1 and the reference voltage VREF2 correspond to a ratio of the regulation output voltage VREG to the feedback voltage VFB. That is, the ratio of the regulation output voltage VREG to the feedback voltage VFB is equal to the above-mentioned gain A=1+R1/R2.

Please refer to FIG. 3B in conjugation with FIG. 2B. In one embodiment, in the sub-OTAs which are cascaded with one another, a transconductance coefficient of an upstream sub-OTA is greater than a transconductance coefficient of a downstream sub-OTA. Taking the sub-OTAs 100_1~100_2 as an example, in one embodiment, the transconductance coefficient gm_2 of the upstream sub-OTA 100_2 is greater than the transconductance coefficient gm_1 of the downstream sub-OTA 100_1. Thus, in a case when the differential input voltage changes, the upstream sub-OTA (e.g., the sub-OTA 100_2) can more instantaneously supply the above-mentioned transient bias current to the downstream sub-OTA (e.g., the sub-OTA 100_1).

Figure 4A:
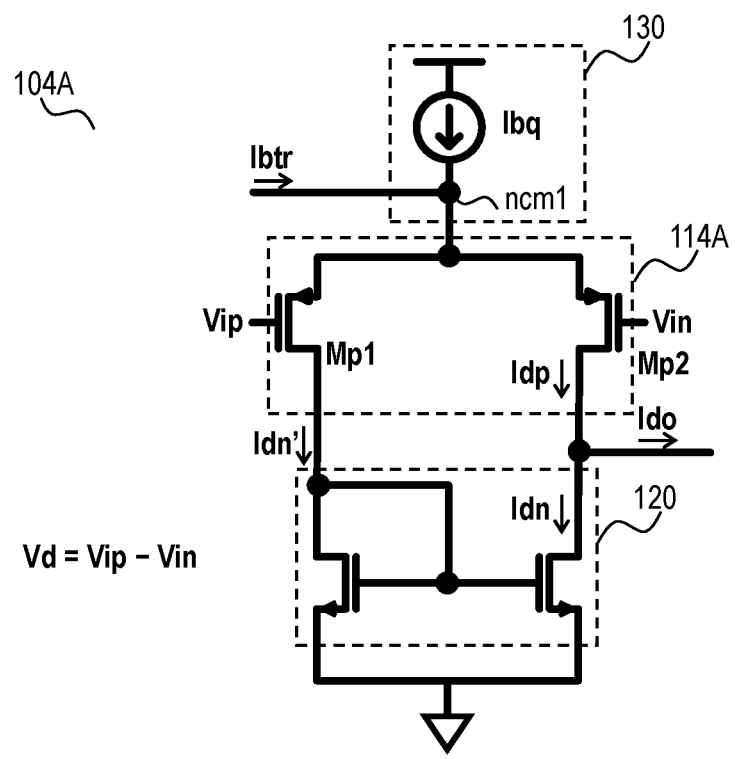
FIGS. 4A-4C show several embodiments of a sub-OTA.
Figure 4B:
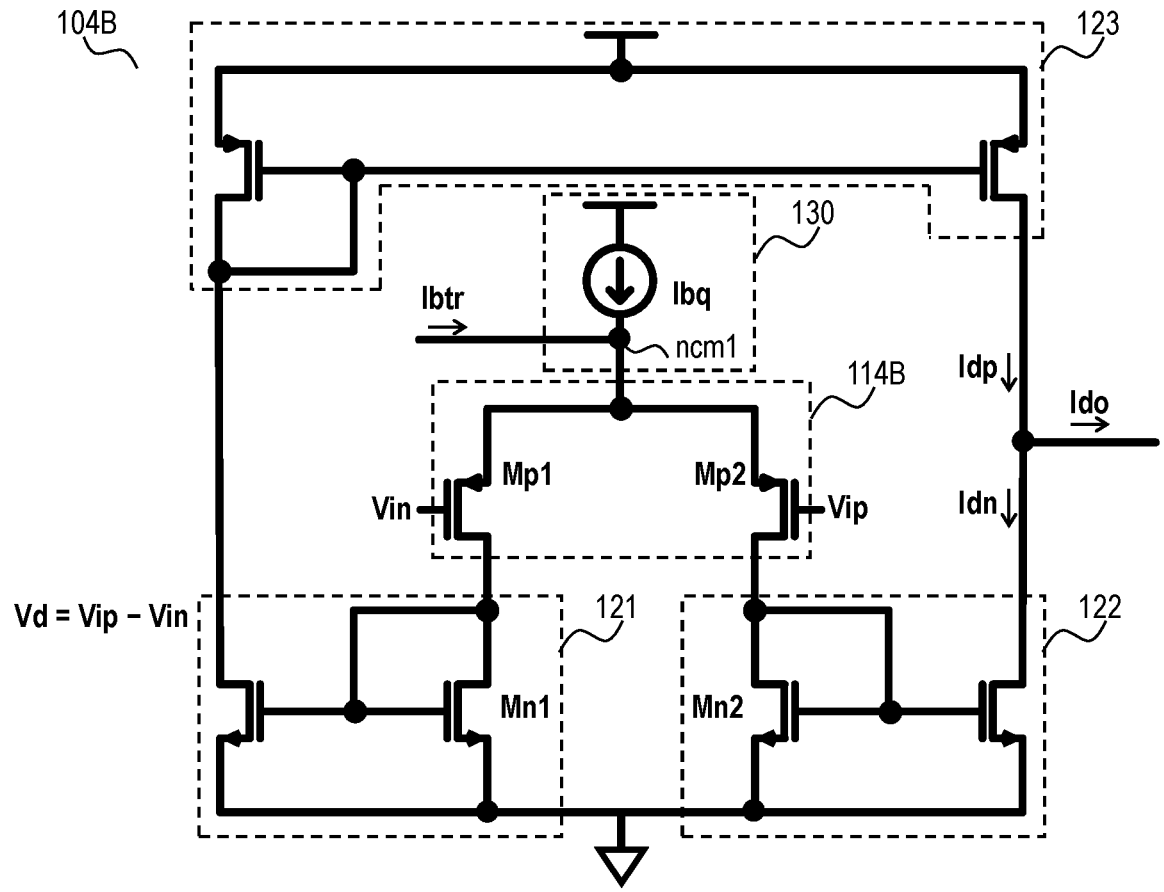
Figure 4C:
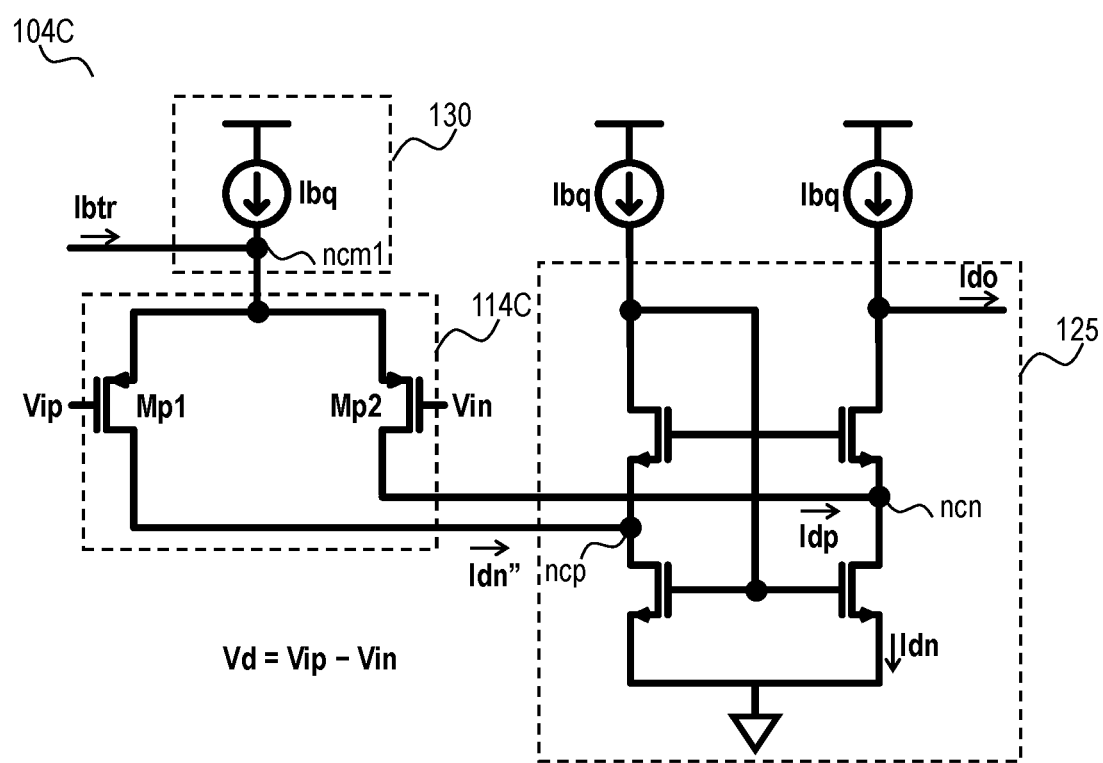

Please refer to FIGS. 4A-4C, which show several embodiments of a sub-OTA (i.e., sub-OTAs 104A~104C). In one embodiment, as shown in FIG. 4A, the sub-OTA 104A is configured as an OTA having single-stage differential input ends and a single output end. An in-phase differential transistor MP1 of a differential amplification pair 114A is configured to operably generate an transconductance current Idn according to a corresponding differential input voltage Vd, whereas, a reversed-phase differential transistor MP2 of the differential amplification pair 114A is configured to operably generate a transconductance current Idp according to the corresponding differential input voltage Vd. A transconductance output current Ido is accordingly generated. To elaborate in more detail, in this embodiment, the transconductance output current Ido is equal to a difference of the transconductance current Idn minus the transconductance current Idp. And, the transconductance output current Ido is equal to a product of the differential input voltage Vd multiplied by a transconductance coefficient gm of the sub-OTA 104A, which can be represented by a following equation: Ido=Vd*gm. It is noteworthy that, as one of average skill in the art readily understands, the "transconductance output current Ido" is an output current correlated with the differential input voltage Vd.

In one embodiment, as shown in FIG. 4A, the above-mentioned transient bias current Ibtr can be inputted to a common mode bias node ncm1 of the sub-OTA 100_4A. A current source 130 can supply a quiescent bias current Ibq via the common mode bias node ncm1 of the sub-OTA 100_4A. In a case when the differential input voltage Vd varies by a transient voltage difference, the transient bias current Ibtr generated by the cascaded upstream sub-OTAs can increase a total amount of a bias current of the differential amplification pair 114A, so as to enhance the loop bandwidth and the response speed during the transient state. On the other hand, after the transient state has ended and the circuitry enters a steady state, the transient bias current Ibtr will gradually reach to zero. As a result, the total amount of the bias current of the differential amplification pair 114A will be reduced, thus enhancing the stability through reducing the loop bandwidth during the steady state.

It is noteworthy that, the common mode bias node ncm1 shown in the figure is only an illustrative example, but not for limiting the scope of the present invention. In a more general aspect, by inputting the transient bias current Ibtr to a common mode bias node, with respect to the low frequency portion, both the bias current of the in-phase differential transistor MP1 and the bias current of the reversed-phase differential transistor MP2 are increased, and also, both the low frequency portion of the transconductance current Idn and the low frequency portion of the reversed-phase transconductance current Idn are increased. Therefore, any node with the above-mentioned characteristics for the DC portion or low frequency portion can function as a "common mode bias node". Other embodiments of the "common mode bias node" will be explained later.

From one perspective, the present invention can increase the loop bandwidth and the response speed during the transient state via the following configurations. In one embodiment, the impedance of the DC bias voltage load (e.g., Z_1) corresponding to an upstream sub-OTA (e.g., as shown by sub-OTA 100_2 in FIG. 2B) is sufficiently large, so that the corresponding cascading capacitor Cc_1 generates a pole P1_1 having a sufficiently low frequency at the common mode bias node (e.g., ncm1) of the sub-OTA 100_1, whereby a sufficiently large phase difference (at least under the case of unit gain bandwidth) exists between the transconductance current Idn and the transconductance current Idp generated by the sub-OTA 100_1. As a result, a relatively larger net output current will be obtained during the transient state, to effectively enhancing the loop bandwidth and the response speed.

Besides, it is noteworthy that, in this embodiment, the reversed-phase differential transistor MP2 can directly generate the transconductance current Idp according to the differential input voltage Vd.

On the other hand, the transconductance current Idn is generated after the in-phase differential transistor MP1 generates a transconductance current Idn' according to the differential input voltage Vd, and the transconductance current Idn' is processed by a current mirror 120. Accordingly, in an implementation wherein the sub-OTA (such as the sub-OTA 104A as shown) is configured as an OTA having single-stage differential input ends and a single output end, this embodiment can further enlarge the phase difference between the transconductance current Idn and the transconductance current Idp during the transient state.

Please refer to FIG. 4B. The sub-OTA 104B of this embodiment shown in FIG. 4B is similar to the sub-OTA 104A of the embodiment shown in FIG. 4A, but is different in that: in this embodiment, an in-phase differential transistor MP1 and a reversed-phase differential transistor MP2 of a differential amplification pair 114B are coupled to a MOS diode MN1 and a MOS diode MN2, respectively, wherein the MOS diode MN1 and the MOS diode MN2 have an identical impedance. The in-phase differential transistor MP1 of the differential amplification pair 114B and the reversed-phase differential transistor MP2 of the differential amplification pair 114B generate a transconductance current Idp and a transconductance current Idn via the current mirror circuits 121, 122 and 123, whereby a transconductance output current Ido is generated.

In one embodiment, as shown in FIG. 4C, the sub-OTA 104C is configured as an OTA having a folded cascaded configuration. The in-phase differential transistor MP1 and the reversed-phase differential transistor MP2 of a differential amplification pair 114C generate a transconductance current Idp and a transconductance current Idn" according to the differential input voltage Vd, respectively. The transconductance current Idp and the transconductance current Idn" are inputted to a cascaded node ncp and a cascaded node ncn of a cascaded current mirror 125, respectively. The cascaded current mirror 125 is configured to receive the transconductance current Idn", so as to generate the transconductance current Idn accordingly.

Similar to the embodiment shown in FIG. 4A, in the embodiments shown in FIG. 4B and FIG. 4C, the above-mentioned transient bias current Ibtr can be inputted to a common mode bias node ncm1 of the sub-OTA 100_4B or the sub-OTA 100_4C. A current source 130 can supply a quiescent bias current Ibq via the common mode bias node ncm1 of the sub-OTA 100_4B or the sub-OTA 100_4C.

Figure 5:
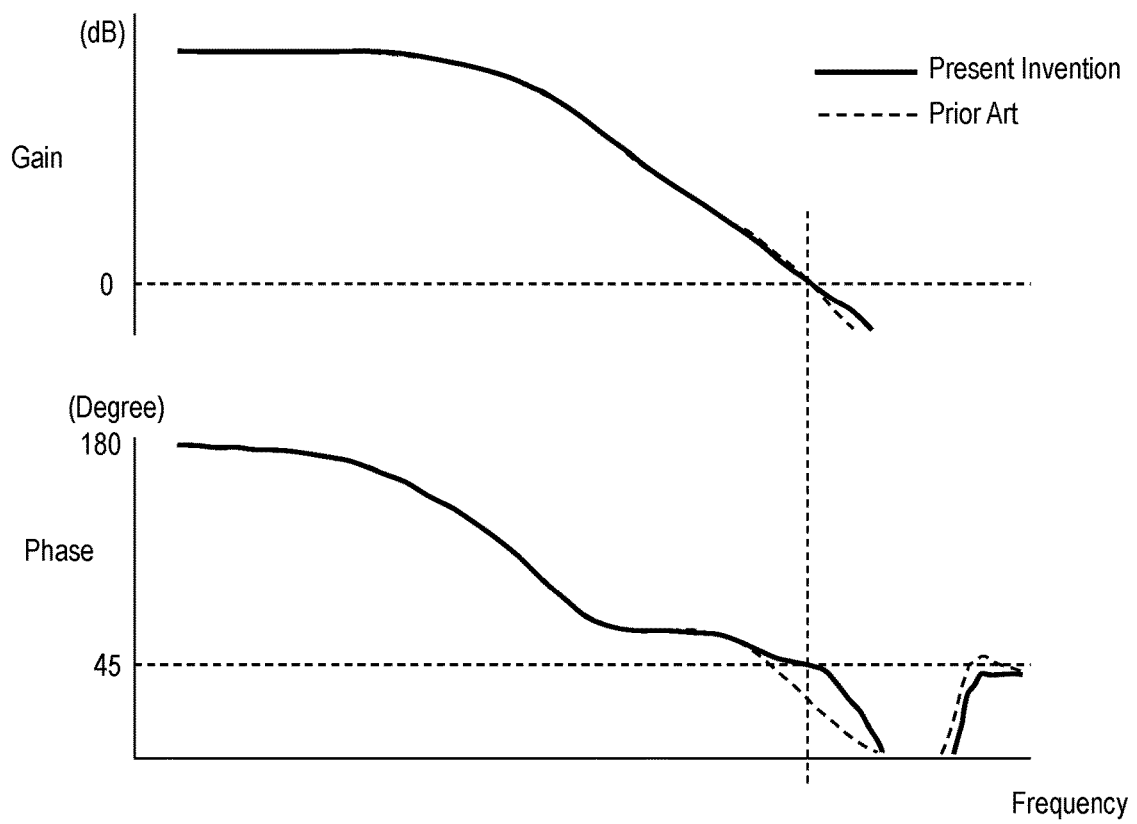
FIG. 5 shows a curve of open-loop frequency response corresponding to the operation of a parallel input and dynamic cascaded OTA of the present invention.

Please refer to FIG. 5, which shows a curve of open-loop frequency response corresponding to the operation of a parallel input and dynamic cascaded OTA of the present invention. As shown in FIG. 5, as compared to an open-loop characteristic corresponding to a prior art OTA which does not have a transient bias current Ibtr (as shown by a dashed line in FIG. 5), according to implementations of the present invention to introduce a transient bias current Ibtr via a cascading capacitor (as shown by a solid line in FIG. 5), the present invention can have a similar unit gain bandwidth, that is, the present invention does not suffer loss of bandwidth in a case when a cascading capacitor is cascaded. Besides, as shown by the solid line in FIG. 5 wherein the transient bias current Ibtr is introduced, the phase margin is relatively higher, which is indicative of a better stability. Taking the sub-OTA 100_1 as an example, a corresponding upstream cascading capacitor (e.g., as shown by Cc_1 in FIG. 2B) generates a zero Zr_1 preceding an unit gain bandwidth of the sub-OTA 100_1, so as to broaden a phase margin of the sub-OTA 100_1. In other words, in terms of time domain, when there is a transient voltage difference occurring in the differential input voltage Vd and transient voltage difference gradually decreases to zero due to feedback, the transient bias current Ibtr will also decrease to zero. Under such situation, the quiescent bias current Ibq drops low to reduce the loop bandwidth and thus enhance the stability, and in addition, the above-mentioned cascading capacitor (such as Cc_1 in FIG. 2B) will continue contributing in compensation and stabilizing the loop. It is noteworthy that, the above-mentioned zero Zr_1 is equal to P1_1/N_1, wherein N_1 denotes a real number greater than one. In one embodiment, by properly selecting the value of N_1, the sub-OTA 100_1 can have a phase margin greater than or equal to 45 degree. In a preferred embodiment, by properly selecting the value of N_1, the sub-OTA 100_1 can have a phase margin greater than or equal to 60 degree.

Figure 6:
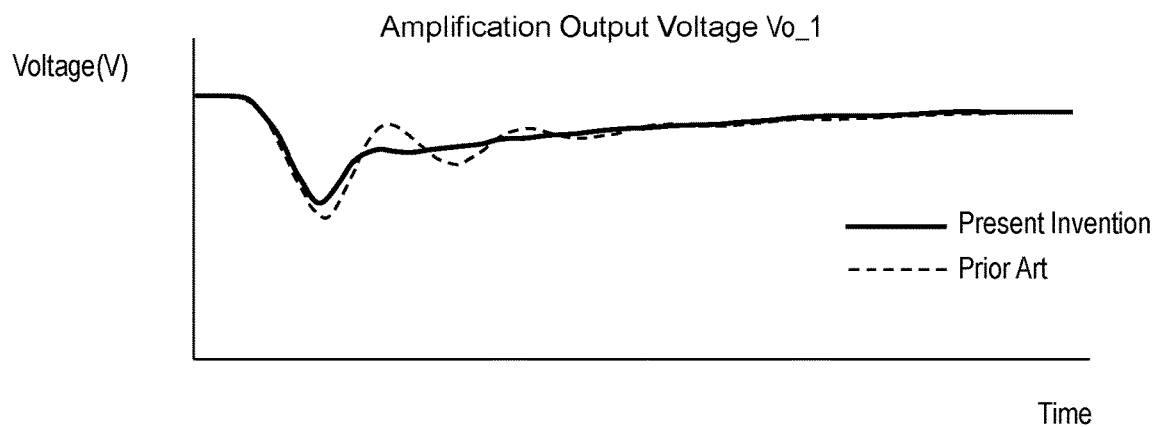
FIG. 6 illustrates a waveform diagram depicting closed-loop frequency response corresponding to the operation of a parallel input and dynamic cascaded OTA of the present invention.

Please refer to FIG. 6, which illustrates a waveform diagram depicting closed-loop frequency response corresponding to the operation of a parallel input and dynamic cascaded OTA of the present invention. As shown in FIG. 6, as compared to a prior art OTA which does not have a transient bias current Ibtr (as shown by the dashed line in FIG. 6), in the embodiment of the present invention wherein a transient bias current Ibtr is introduced via a cascading capacitor (as shown by the solid line in FIG. 6), the present invention can resume to a stable state in a shorter time.

Figure 7:
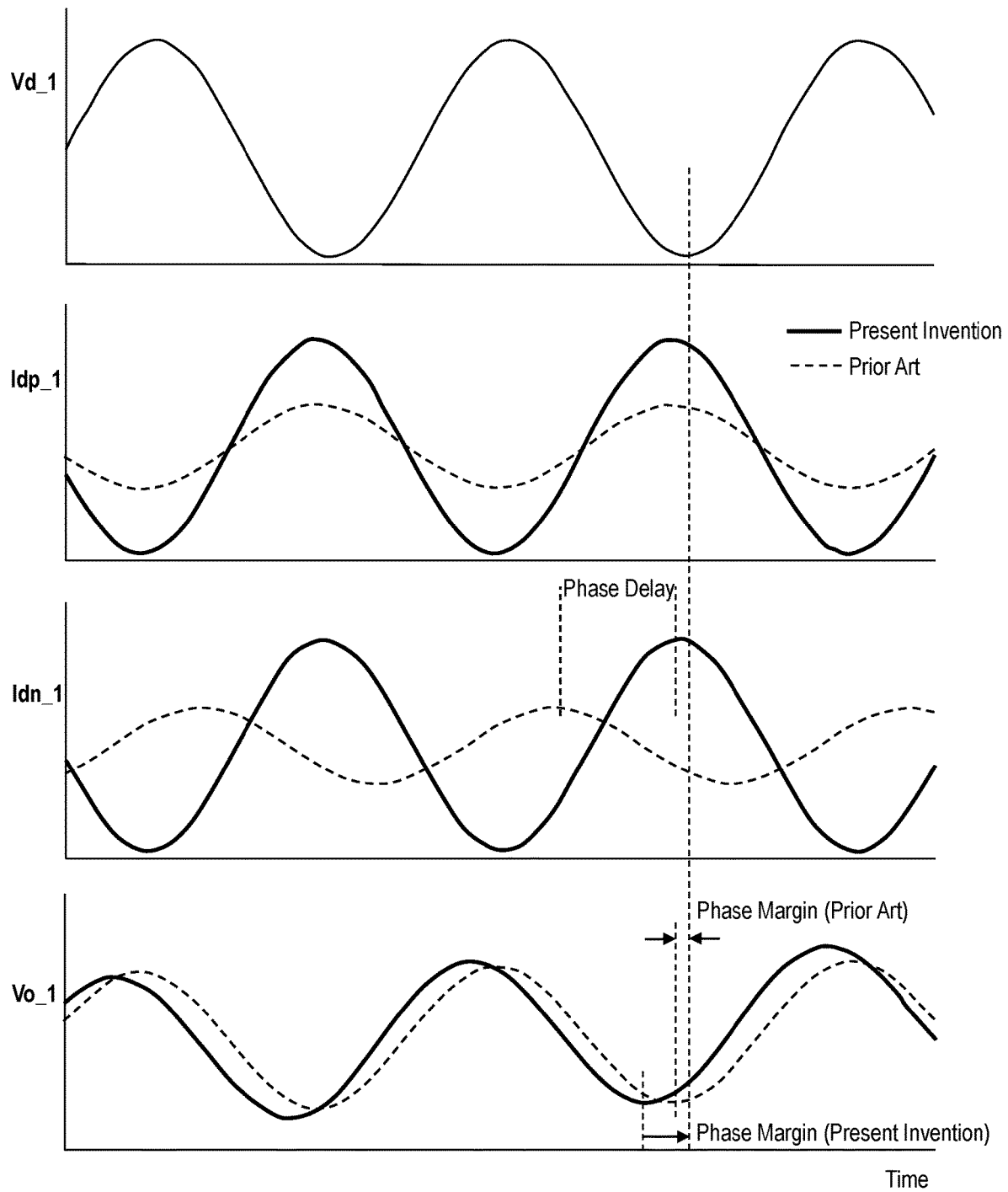
FIG. 7 illustrates waveform diagrams depicting open-loop frequency response corresponding to minor signals generated during the operation of a parallel input and dynamic cascaded OTA of the present invention.

Please refer to FIG. 7, which illustrates waveform diagrams depicting open-loop frequency response corresponding to minor signals generated during the operation of a parallel input and dynamic cascaded OTA of the present invention. As shown in FIG. 7, as compared to a prior art OTA which does not have a transient bias current Ibtr (as shown by the dashed lines in FIG. 7), in the embodiment of the present invention wherein a transient bias current Ibtr is introduced via a cascading capacitor (as shown by the solid lines in FIG. 7), the present invention can generate relatively larger transconductance currents Idn and Idp. Besides, because the current difference of Idp−Idn has a relatively smaller phase delay, the output voltage corresponding to these minor signals can have a relatively larger phase margin.

Please refer to FIGS. 8A-8D, which show several embodiments of a current source (i.e., current sources 138A~138D) for supplying the quiescent bias current Ibq. In one embodiment, as shown in FIG. 8, a current source 138A includes a mirror transistor Mm1, which is configured to operably mirror a current. A current output end of the mirror transistor Mm1 is coupled to a common mode bias node ncm1, so as to generate the quiescent bias current Ibq. In this embodiment, a cascading capacitor Cc is electrically coupled to the current output end (i.e., common mode bias node ncm1) of the mirror transistor Mm1, so as to receive an upstream transconductance current (e.g., transconductance current Ido_2) and to supply the transient bias current Ibtr to a differential amplification pair 118 via the common mode bias node ncm1.

Figure 8A:
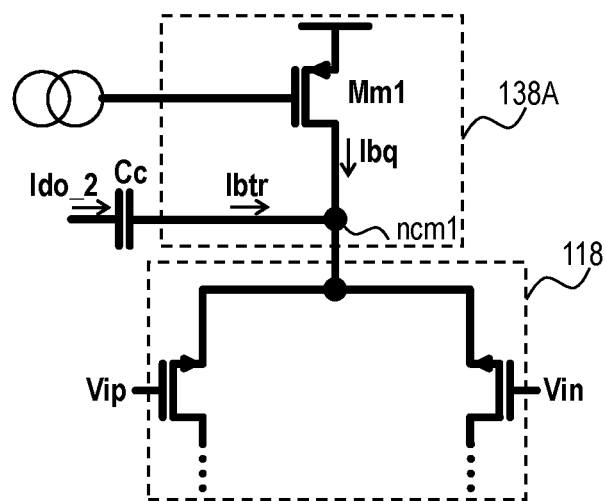
FIGS. 8A-8D show several embodiments of a current source for supplying a quiescent bias current Ibq.
Figure 8B:
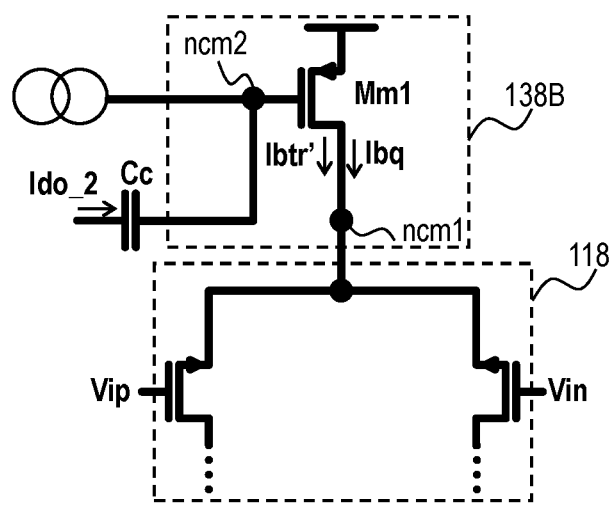

In one embodiment, as shown in FIG. 8B, a current source 138B includes a mirror transistor Mm1, which is configured to operably mirror a current. A current output end of the mirror transistor Mm1 is coupled to a common mode bias node ncm2, so as to generate the quiescent bias current Ibq. In this embodiment, a cascading capacitor Cc is electrically coupled to a control end (i.e., a gate, which corresponds to the common mode bias node ncm2) of the mirror transistor Mm1. In this embodiment, the transient bias current Ibtr can control the mirror transistor Mm1 via the common mode bias node ncm2, so as to generate a transient bias current Ibtr', which is supplied to a differential amplification pair 118. In other words, on one hand, the mirror transistor Mm1 mirrors to generate the quiescent bias current Ibq, while one the other hand, the mirror transistor Mm1 is coupled to an upstream transconductance current (e.g., transconductance current Ido_2) via the cascading capacitor Cc, so as to control the control end of the mirror transistor Mm1, thus generating the transient bias current Ibtr', and the quiescent bias current Ibq and the transient bias current Ibtr' are supplied to the differential amplification pair 118. Certainly, in this embodiment, the in-phase input end and the reversed-phase input end of the upstream sub-OTA should be modified correspondingly.

Figure 8C:
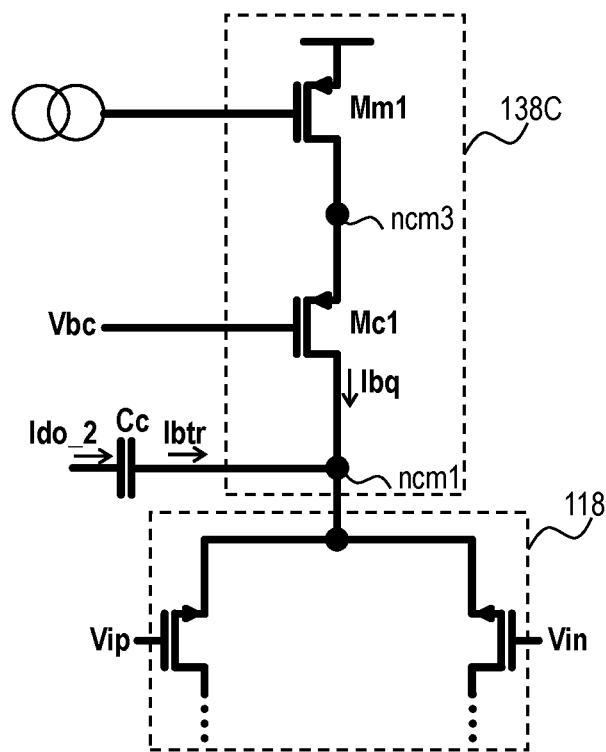

In one embodiment, as shown in FIG. 8C, a current source 138C includes a mirror transistor Mm1 which is configured to operably mirror a current and a cascaded transistor Mc1 which is configured to operably increase an output impedance. The mirror transistor Mm1 and the cascaded transistor Mc1 are cascaded to each other between a supply voltage and a common mode bias node ncm1 (i.e., connected with each other at a common mode bias node ncm3). The cascaded transistor Mc1 is biased by a cascaded bias voltage Vbc. In this embodiment, a cascading capacitor Cc is electrically coupled to the current output end (i.e., common mode bias node ncm1) of the cascaded transistor Mc1, so as to supply the transient bias current Ibtr to a differential amplification pair 118 via the common mode bias node ncm1.

Figure 8D:
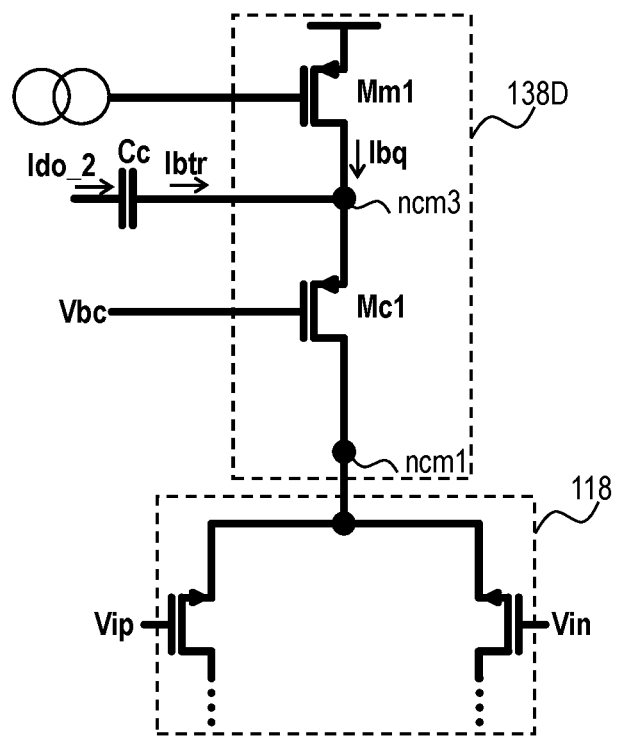

In one embodiment, as shown in FIG. 8D, a current source 138D includes a mirror transistor Mm1 which is configured to operably mirror a current and a cascaded transistor Mc1 which is configured to operably increase an output impedance. The mirror transistor Mm1 and the cascaded transistor Mc1 are cascaded to each other between a supply voltage and a common mode bias node ncm1. The cascaded transistor Mc1 is biased by a cascaded bias voltage Vbc. In this embodiment, a cascading capacitor Cc is electrically coupled to a node (i.e., common mode bias node ncm3) where the mirror transistor Mm1 and the cascaded transistor Mc1 are cascaded to each other, so as to supply the transient bias current Ibtr to a differential amplification pair 118 via the common mode bias node ncm3.

Figure 9A:
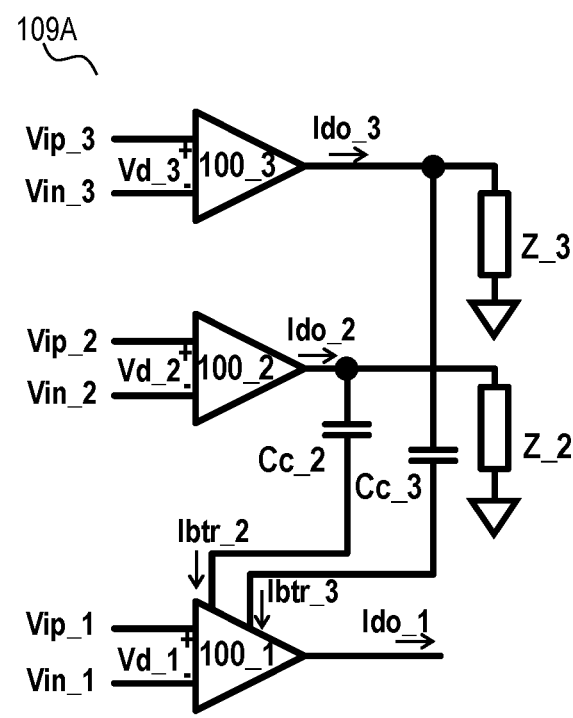
FIG. 9A and FIG. 9B show schematic diagrams of a parallel input and dynamic cascaded OTA according to an embodiment of the present invention.
Figure 9B:
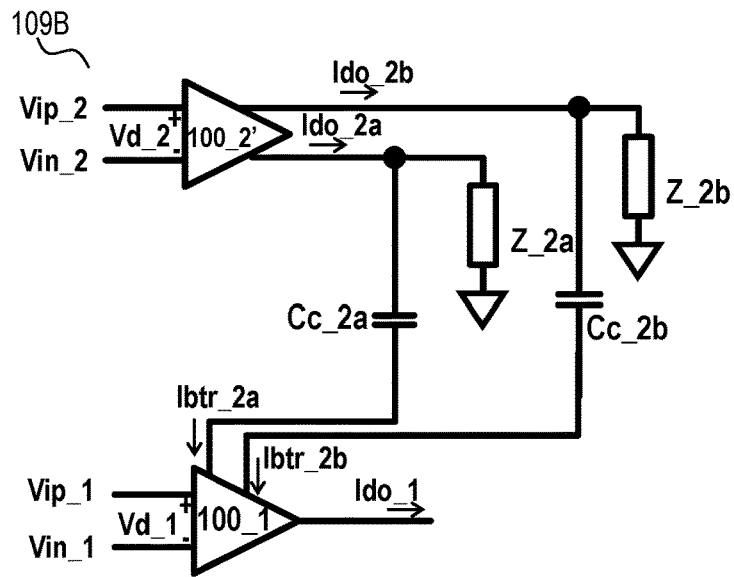

Please refer to FIG. 9A and FIG. 9B, which show schematic diagrams of a parallel input and dynamic cascaded OTA (i.e., parallel input and dynamic cascaded OTAs 109A-109B) according to an embodiment of the present invention. According to the spirit of the present invention, it is not limited to introducing one or more transient bias currents at one single common mode bias node of a sub-OTA. In one embodiment, via plural cascading capacitors, one sub-OTA in the parallel input and dynamic cascaded OTA can receive plural transient bias currents at plural common mode bias nodes of that single sub-OTA.

In one embodiment, as shown in FIG. 9A, a sub-OTA 100_1 can receive a transient bias current Ibtr_2 from an upstream sub-OTA 100_2 and a transient bias current Ibtr_3 from an upstream sub-OTA 100_3 at different common mode bias nodes of the sub-OTA 100_1. In another embodiment, as shown in FIG. 9B, via cascading capacitors Cc_2a and Cc_2b, a sub-OTA 100_1 can receive a transient bias current Ibtr_2a and a transient bias current Ibtr_2b from a sub-OTA 100_2' at common mode bias nodes of the sub-OTA 100_1. In this embodiment, the sub-OTA 100_2' can output transconductance output currents Ido_2a and Ido_2b, both of which can be independently adjusted. As a result, through individually adjusting a current ratio and impedances of DC bias voltage loads Z_2a and Z_2b, this embodiment can design different poles and zeros, which will not affect each other.

Figure 9C:
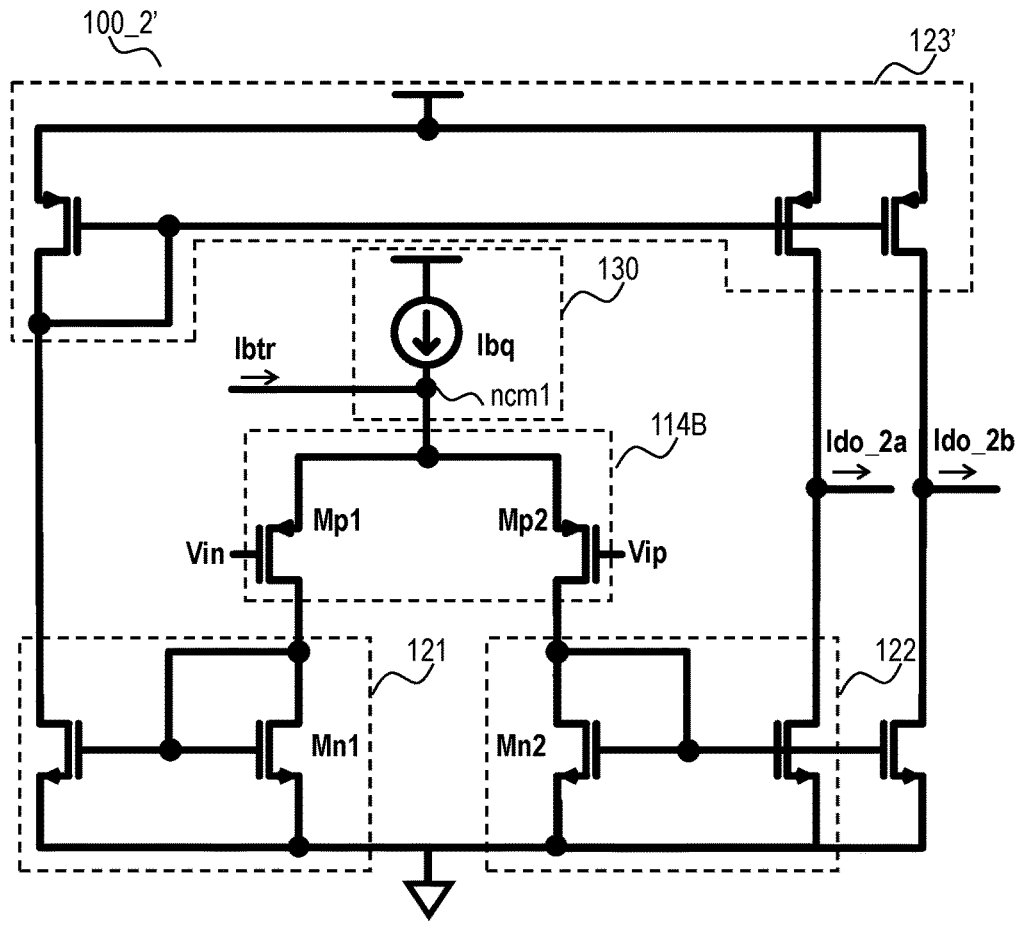
FIG. 9C shows a specific embodiment of a sub-OTA.

FIG. 9C shows a specific embodiment of a sub-OTA (i.e., sub-OTA 100_2') according to the present invention. In this embodiment, via a current mirror circuit 123', the sub-OTA 100_2' can generate transconductance output currents Ido_2a and Ido_2b, both of which can be independently adjusted.

Figure 10A:
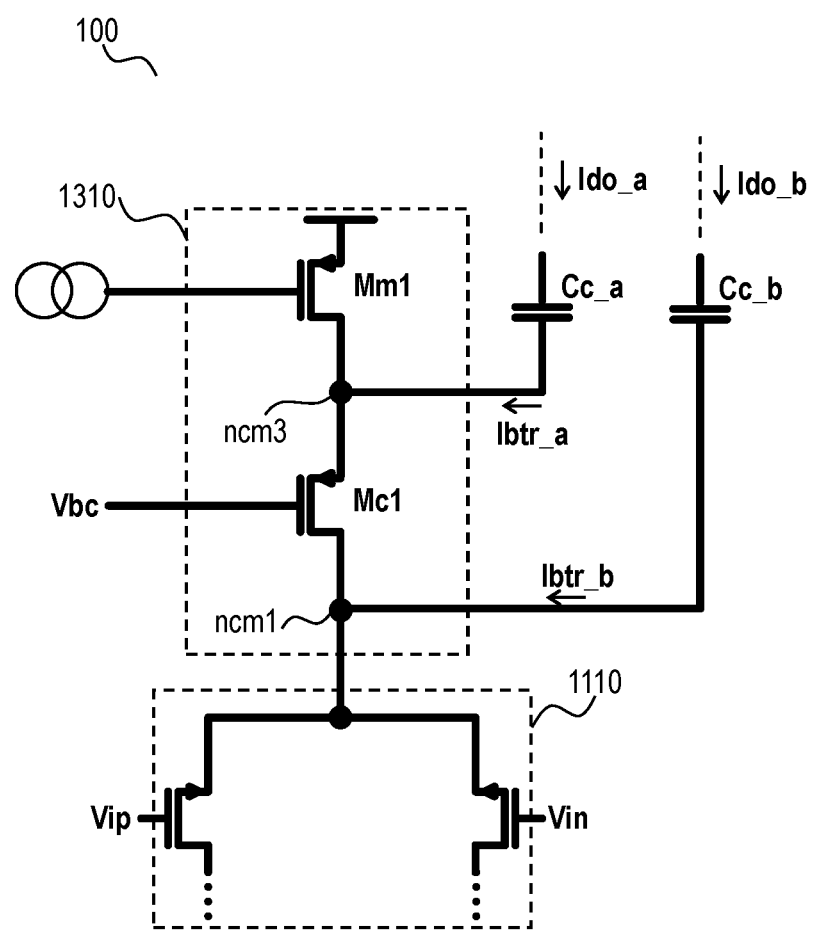
FIG. 10A and FIG. 10B show specific embodiments of sub-OTAs and current sources therein for supplying quiescent bias currents.

Please refer to FIG. 10A, which shows a specific embodiment of a sub-OTA and a specific embodiment of a current source (i.e., current source 1310) therein for supplying quiescent bias currents. In one embodiment, the current source 1310 of the sub-OTA 100 is configured as the above-mentioned cascaded current source. As shown in FIG. 10A, the current source 1310 includes a mirror transistor Mm1 which is configured to operably mirror a current and a cascaded transistor Mc1 which is configured to operably increase an output impedance. The mirror transistor Mm1 and the cascaded transistor Mc1 are cascaded to each other between a supply voltage and a common mode bias node ncm1. The cascaded transistor Mc1 is biased by a cascaded bias voltage Vbc. In this embodiment, the common mode bias nodes (i.e., ncm1 and ncm3) can receive different transient bias currents Ibtr_a and Ibtr_b from different cascading capacitors Cc_a and Cc_b, respectively. To be more specific, the cascading capacitor Cc_a is electrically coupled to anode (i.e., common mode bias node ncm3) where the mirror transistor Mm1 and the cascaded transistor Mc1 are cascaded to each other, so as to supply the transient bias current Ibtr_a to a differential amplification pair 1110 via the common mode bias node ncm3 (note that transient bias current Ibtr_a also flows through the common mode bias node ncm1). On the other hand, the cascading capacitor Cc_b is electrically coupled to a current output node (i.e., common mode bias node ncm1) of the cascaded transistor Mc1, so as to supply the transient bias current Ibtr_b to the differential amplification pair 1110 via the common mode bias node ncm1. The above-mentioned transient bias current Ibtr_a and transient bias current Ibtr_b can correspond to for example the transient bias current Ibtr_2 and the transient bias current Ibtr_3 in the embodiment shown in FIG. 9A, respectively; or, the above-mentioned transient bias current Ibtr_a and transient bias current Ibtr_b can correspond to for example the transient bias current Ibtr_2a and the transient bias current Ibtr_2b in the embodiment shown in FIG. 9B, respectively.

Figure 10B:
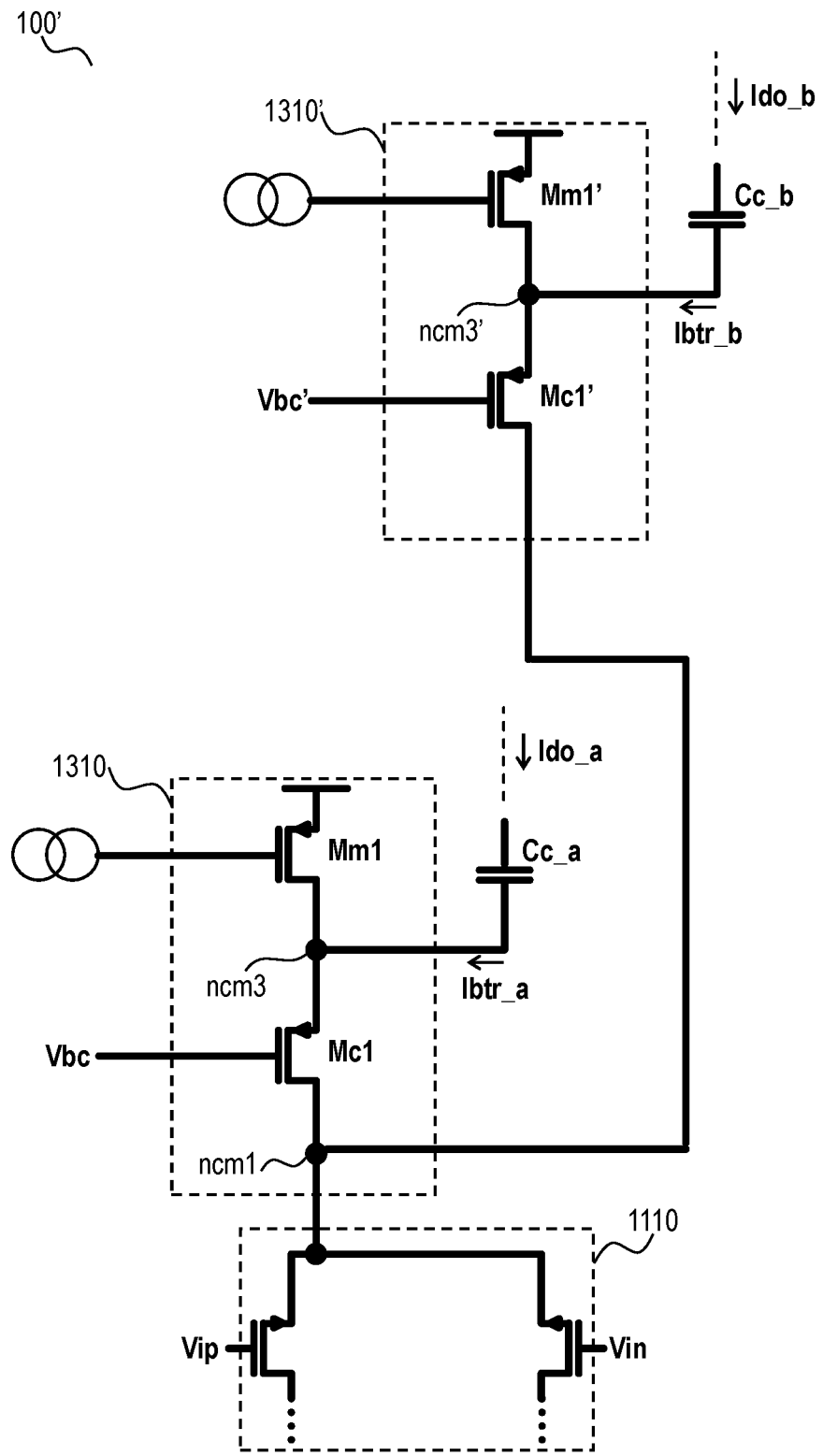

Please refer to FIG. 10B, which shows a specific embodiment of a sub-OTA and a specific embodiment of current sources (i.e., current source 1310 and current source 1310') therein for supplying quiescent bias currents. In one embodiment, the current sources 1310 and 1310' of the sub-OTA 100' are configured as the above-mentioned cascaded current sources. As shown in FIG. 10B, the current source 1310 includes a mirror transistor Mm1 which is configured to operably mirror a current and a cascaded transistor Mc1 which is configured to operably increase an output impedance, whereas, the current source 1310' includes a mirror transistor Mm1' which is configured to operably mirror a current and a cascaded transistor Mc1' which is configured to operably increase an output impedance. The mirror transistor Mm1 and the cascaded transistor Mc1 are cascaded to each other between a supply voltage and a common mode bias node ncm1. The mirror transistor Mm1' and the cascaded transistor Mc1' are cascaded to each other between the supply voltage and the common mode bias node ncm1. The cascaded transistor Mc1 is biased by a cascaded bias voltage Vbc, whereas, the cascaded transistor Mc1' is biased by a cascaded bias voltage Vbc'. In this embodiment, the common mode bias nodes can receive different transient bias currents Ibtr_a and Ibtr_b from different cascading capacitors Cc_a and Cc_b, respectively. To be more specific, the cascading capacitor Cc_a is electrically coupled to a node (i.e., common mode bias node ncm3) where the mirror transistor Mm1 and the cascaded transistor Mc1 are cascaded to each other, so as to supply the transient bias current Ibtr_a to a differential amplification pair 1110 via the common mode bias node ncm3 (note that the transient bias current Ibtr_a also flows through the common mode bias node ncm1). On the other hand, the cascading capacitor Cc_b is electrically coupled to a node (i.e., common mode bias node ncm3') where the mirror transistor Mm1' and the cascaded transistor Mc1' are cascaded to each other, so as to supply the transient bias current Ibtr_b to the differential amplification pair 1110 via the common mode bias node ncm3' (note that transient bias current Ibtr_b also flows through the common mode bias node ncm1).

It is noteworthy that, in this embodiment, during a transient state, the differential amplification pair 1110 actually receives a sum of the transient bias current Ibtr_a plus the transient bias current Ibtr_b. Consequently, this embodiment can effectively increase the loop bandwidth and the response speed during the transient state. Beside, this embodiment can reduce the transient bias current during a steady state, so as to enhance stability through reducing the loop bandwidth. In addition, because the transient bias current Ibtr_a and the transient bias current Ibtr_b are introduced to two ends of the cascaded transistor Mc1, respectively, the cascaded transistor Mc1 or Mc1' can also provide an impedance buffer function between the cascading capacitor Cc_a and the cascading capacitor Cc_b.

Figure 11:
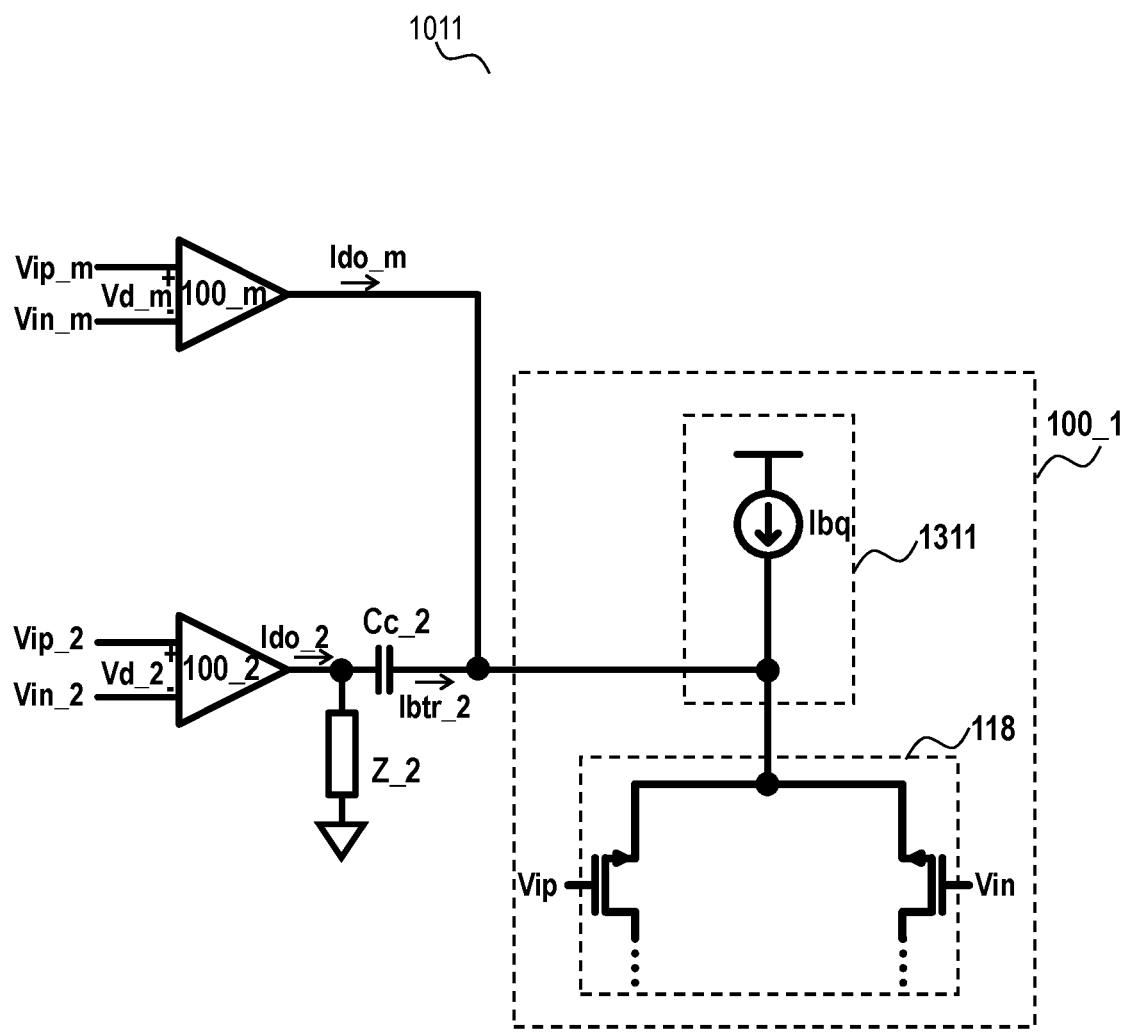
FIG. 11 shows a specific embodiment of a sub-OTA and a current source therein for supplying a bias current.

Please refer to FIG. 11 shows a specific embodiment of a sub-OTA and a specific embodiment of a current source (i.e., current source 1311) therein for supplying a bias current. In one embodiment, as shown in FIG. 11, a parallel input and dynamic cascaded OTA 1011 further comprises an additional sub-OTA 100_m, wherein m denotes a positive integer which is not equal to 1~n. The sub-OTA 100_m of this embodiment is similar to the above-mentioned sub-OTAs 100_1~100_n, but is different in that: a transconductance output current Ido_m of the sub-OTA 100_m is directly electrically coupled to the common mode bias node ncm1 of the sub-OTA 100_1, as shown in FIG. 11.

In other words, in this embodiment, the transconductance output current Ido_m of the sub-OTA 100_m and the transconductance output current Ido_2 of the sub-OTA 100_2 are introduced to two ends of a cascading capacitor Cc_2, respectively. Under such circumstance, two ends of the cascading capacitor Cc_2 will simultaneously receive currents, both of which are in-phase to each other and both of which have a similar current level. From one perspective, the cascading capacitor Cc_2 will not incur a load effect upon the transconductance output current Ido_2. That is, the cascading capacitor Cc_2 will not respond to a common mode signal, but will only respond to a differential mode signal, so that this embodiment can more effectively achieve the above-mentioned efficacies.

Figure 12A:
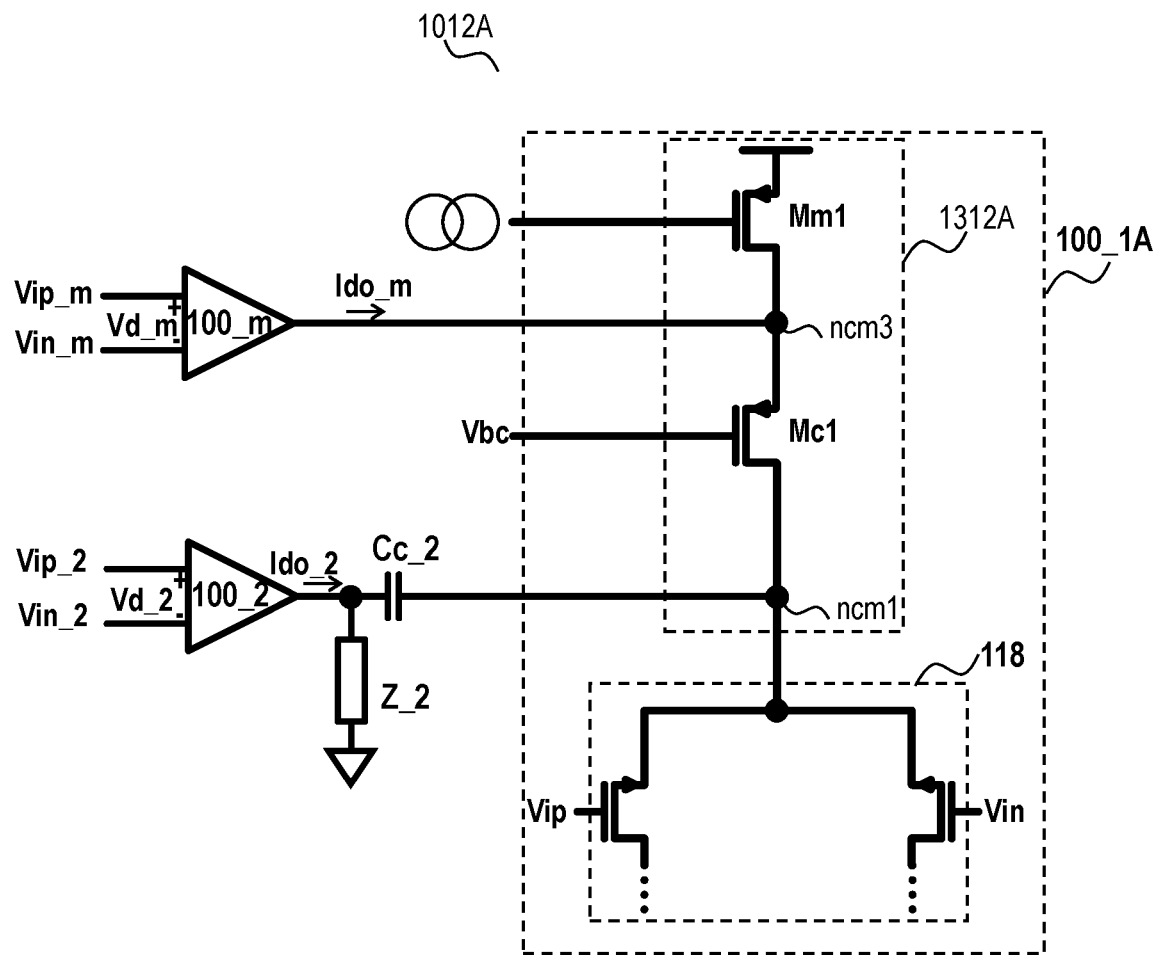
FIGS. 12A-12C show several specific embodiments of sub-OTAs and current sources therein for supplying a bias current.
Figure 12B:
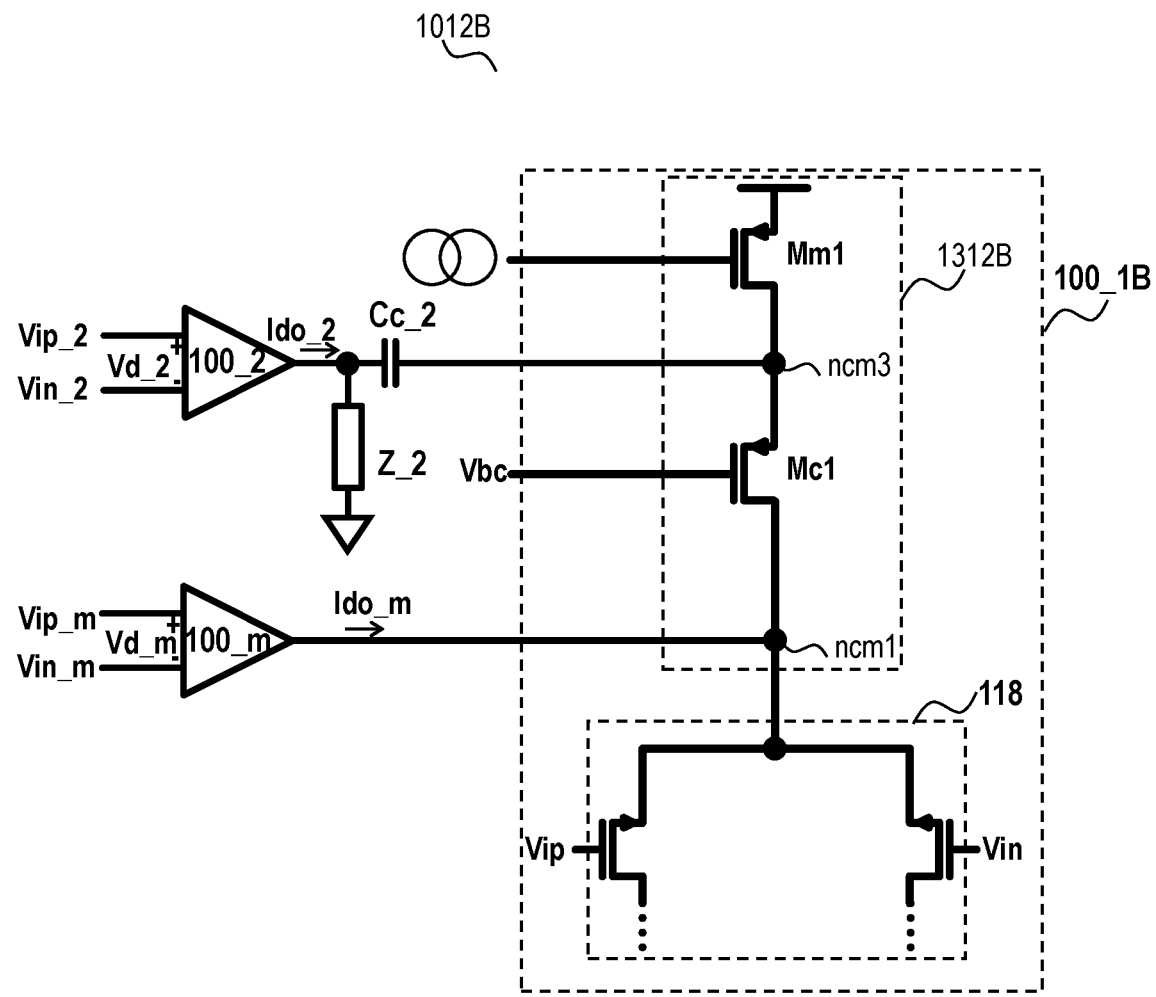

Please refer to FIGS. 12A-12B, which show two specific embodiments of sub-OTAs and current sources (i.e., current source 1312A and current source 1312B) therein for supplying a bias current. In one embodiment, the embodiments shown in FIGS. 12A-12B are similar to the embodiment shown in FIG. 11, that is, the parallel input and dynamic cascaded OTA 1012A or 1012B further comprises an additional sub-OTA 100_m. However, the embodiments shown in FIGS. 12A-12B are different from the embodiment shown in FIG. 11, in that: in the embodiment shown in FIG. 12A, the transconductance output current Ido_m of the sub-OTA 100_m and the transconductance output current Ido_2 of the sub-OTA 100_2 are introduced to the common mode bias node ncm3 and the common mode bias node ncm1 of the sub-OTA 100_1, respectively (as shown in FIG. 12A), while in the embodiment shown in FIG. 12A, the transconductance output current Ido_m of the sub-OTA 100_m and the transconductance output current Ido_2 of the sub-OTA 100_2 are introduced to the common mode bias node ncm1 and the common mode bias node ncm3 of the sub-OTA 100_1, respectively (as shown in FIG. 12B).

Figure 12C:
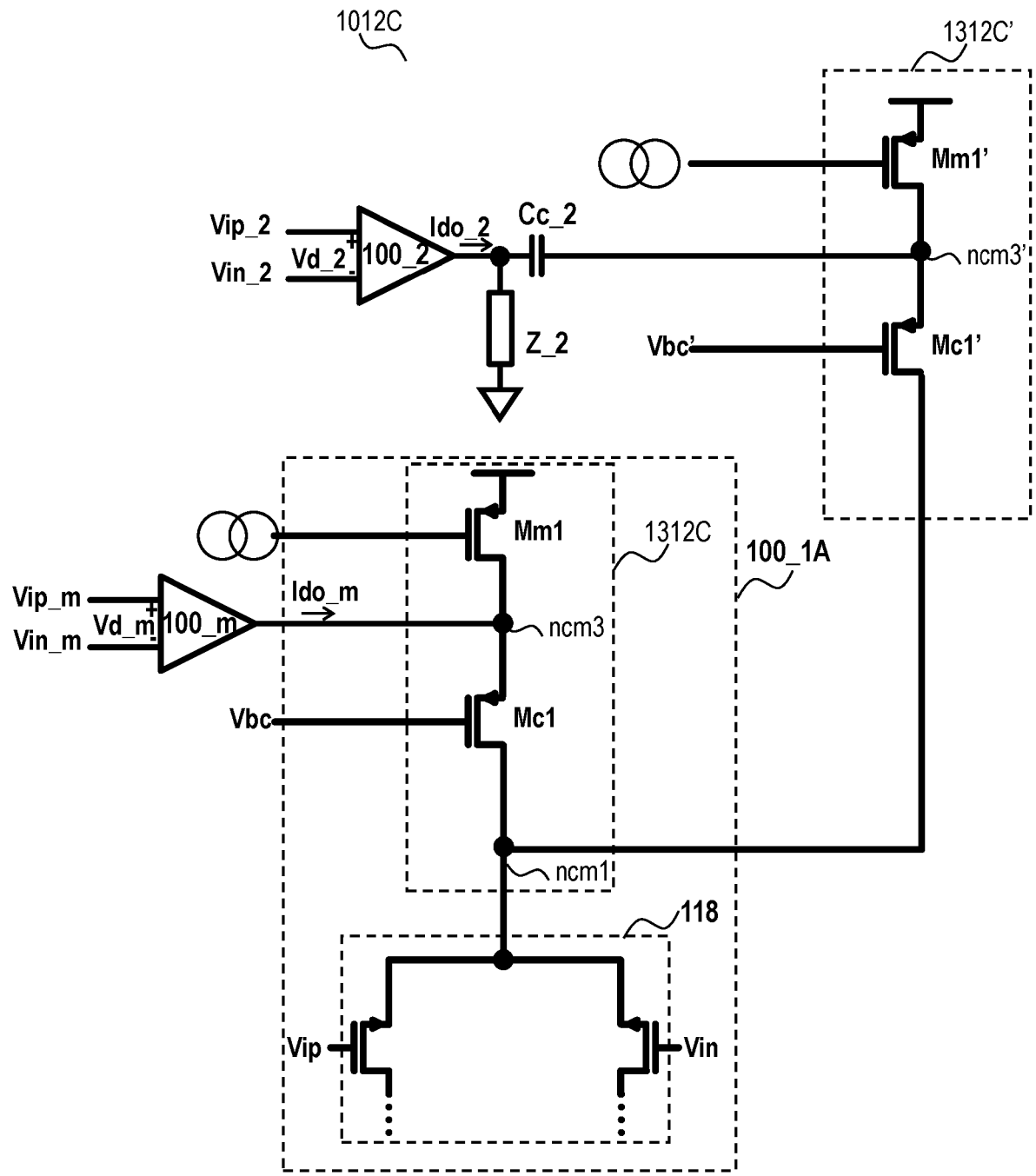

Please refer to FIGS. 12C, which shows a specific embodiment of a sub-OTA and a current source (i.e., current source 1312C) therein for supplying a bias current. This embodiment shown in FIG. 12C is similar to the embodiment shown in FIG. 12B, but is different in that: in this embodiment, the transconductance output current Ido_2 of the sub-OTA 100_2 is first introduced to a common mode bias node ncm3' of the current source 1312C', and thereafter introduced to the common mode bias node ncm1 via a cascaded transistor Mc1'. As the result, the transconductance output current Ido_2 and the transconductance output current Ido_m can be effectively isolated from each other, so that the transconductance output current Ido_2 and the transconductance output current Ido_m can be designed individually and independently, so as not to affect each other.

Certainly, in other embodiments, it is also practicable and within the scope of the present invention that the common mode bias node where the transconductance output current Ido_m is introduced into and the common mode bias node where the transconductance output current Ido_2 is introduced into can be interchanged, which is not redundantly explained here.

The present invention has been described in considerable detail with reference to certain preferred embodiments thereof. It should be understood that the description is for illustrative purpose, not for limiting the broadest scope of the present invention. An embodiment or a claim of the present invention does not need to achieve all the objectives or advantages of the present invention. The title and abstract are provided for assisting searches but not for limiting the scope of the present invention. Those skilled in this art can readily conceive variations and modifications within the spirit of the present invention. For example, to perform an action "according to" a certain signal as described in the context of the present invention is not limited to performing an action strictly according to the signal itself, but can be performing an action according to a converted form or a scaled-up or down form of the signal, i.e., the signal can be processed by a voltage-to-current conversion, a current-to-voltage conversion, and/or a ratio conversion, etc. before an action is performed. It is not limited for each of the embodiments described hereinbefore to be used alone; under the spirit of the present invention, two or more of the embodiments described hereinbefore can be used in combination. For example, two or more of the embodiments can be used together, or, a part of one embodiment can be used to replace a corresponding part of another embodiment. In view of the foregoing, the spirit of the present invention should cover all such and other modifications and variations, which should be interpreted to fall within the scope of the following claims and their equivalents.

What is claimed is:

1. A parallel input and dynamic cascaded operational transconductance amplifier (OTA), comprising: a plurality of sub-OTAs, wherein each sub-OTA is configured to operably generate a corresponding transconductance output current according to a differential input voltage which is linearly coupled to the plurality of sub-OTAs, wherein the plurality of sub-OTAs include a first sub-OTA and a second sub-OTA; and at least one cascading capacitor, which is cascaded between the first sub-OTA and the second sub-OTA, wherein the at least one cascading capacitor includes a first cascading capacitor, which is cascaded between the first sub-OTA and the second sub-OTA; wherein a second transconductance output current generated by the second sub-OTA is coupled through the first cascading capacitor to generate an AC coupled (coupled in an alternating current manner) transient bias current on a common mode bias node of the first sub-OTA, thus providing the AC coupled transient bias current to both a non-inverting transconductance current and an inverting transconductance current of a differential pair circuit of the first sub-OTA in a case when a transient state occurs in the differential input voltage corresponding to the first sub-OTA, wherein the non-inverting transconductance current and the inverting transconductance current of the differential pair circuit during the transient state have a phase difference which is sufficiently large that an transconductance output current of the differential pair circuit is enhanced to an extent, so that a loop bandwidth and a response speed during the transient state are enhanced, and during a steady state, the AC coupled transient bias current is reduced, so as to enhance stability through reducing the loop bandwidth.

2. The parallel input and dynamic cascaded OTA of claim 1, wherein a pair of differential input ends of the first sub-OTA are connected in parallel with a pair of differential input ends of the second sub-OTA.

3. The parallel input and dynamic cascaded OTA of claim 1, wherein a transconductance coefficient of the second sub-OTA is greater than a transconductance coefficient of the first sub-OTA, such that the phase difference between the non-inverting transconductance current and the inverting transconductance current during the transient state is sufficiently large.

4. The parallel input and dynamic cascaded OTA of claim 1, further comprising:
   a direct current (DC) bias voltage load, which is coupled to an output end of the second sub-OTA and which is coupled to the first cascading capacitor, wherein the DC bias voltage load is configured to operably receive the second transconductance output current, so as to provide a corresponding DC bias voltage at the output end of the second sub-OTA.

5. The parallel input and dynamic cascaded OTA of claim 4, wherein the DC bias voltage load includes a metal oxide semiconductor (MOS) diode.

6. The parallel input and dynamic cascaded OTA of claim 4, wherein each sub-OTA is configured as an OTA having a pair of differential input ends and a single output end, wherein an of the DC bias voltage load impedance corresponding to the second sub-OTA is large to an extent such that the first cascading capacitor generates a pole having a sufficiently low frequency at the common mode bias node of the first sub-OTA, thus causing the phase difference large to an extent that the transconductance output current is enhanced during the transient state, and/or that under a unit gain bandwidth, the parallel input and dynamic cascaded OTA has a phase margin greater than or equal to 45 degree.

7. The parallel input and dynamic cascaded OTA of claim 6, wherein the first cascading capacitor is configured to operably generate a zero preceding a unit gain bandwidth of the first sub-OTA, such that under the unit gain bandwidth, the parallel input and dynamic cascaded OTA has a phase margin greater than or equal to 45 degree.

8. The parallel input and dynamic cascaded OTA of claim 1, wherein one of the plurality of sub-OTAs is configured as one of the following:
   (1) an OTA having single-stage differential input ends and a single output end, wherein the transconductance amplifier having the single-stage differential input ends and the single output end includes: an non-inverting differential transistor and a inverting differential transistor, wherein the non-inverting differential transistor is configured to operably generate an non-inverting transconductance current according to the corresponding differential input voltage, whereas, the inverting differential transistor is configured to operably generate a inverting transconductance current according to the corresponding differential input voltage; wherein the non-inverting differential transistor is coupled to a MOS diode; or
   (2) an OTA having balance differential input ends and a single output end, wherein the transconductance amplifier having the balance differential input ends and the single output end includes: an non-inverting differential transistor and a inverting differential transistor, wherein the non-inverting differential transistor is configured to operably generate an non-inverting transconductance current according to the corresponding differential input voltage, whereas, the inverting differential transistor is configured to operably generate a inverting transconductance current according to the corresponding differential input voltage; wherein the non-inverting differential transistor is coupled to a corresponding MOS diode, whereas, the inverting differential transistor is coupled to another corresponding MOS diode; or
   (3) an OTA having folded cascaded differential input ends and a single output end, wherein the transconductance amplifier having the folded cascaded differential input ends and the single output end includes: an non-inverting differential transistor, a inverting differential transistor and a cascaded current mirror circuit, which are configured to operably generate an non-inverting transconductance current and a inverting transconductance current according to the corresponding differential input voltage; wherein the non-inverting differential transistor is coupled to a corresponding cascaded node of the cascaded current mirror circuit, whereas, the inverting differential transistor is coupled to another corresponding cascaded node of the cascaded current mirror circuit.

9. The parallel input and dynamic cascaded OTA of claim 8, wherein each sub-OTA includes: a current source circuit which is coupled to the non-inverting differential transistor and the inverting differential transistor, wherein the common mode bias node is one of the following:
   (1) the common mode bias node is a coupling node among the current source circuit, the non-inverting differential transistor and the inverting differential transistor;
   (2) the common mode bias node is a control end of the current source circuit; or
   (3) the common mode bias node is a cascaded node of the current source circuit, wherein the current source circuit is configured as a cascaded current source circuit.

10. The parallel input and dynamic cascaded OTA of claim 1, wherein the first sub-OTA is configured to operably receive another transient bias current on another common mode bias node of the first sub-OTA via another cascading capacitor, thus providing the another transient bias current to the differential pair circuit of the first sub-OTA in a case when a transient state occurs in the differential input voltage corresponding to the first sub-OTA, so that the loop bandwidth and the response speed during the transient state are enhanced and during the steady state, the another transient bias current is reduced, so as to enhance stability through reducing the loop bandwidth; wherein the another transient bias current is generated according of to one the following configurations:
   (1) the second sub-OTA is further configured to operably generate the another transient bias current; or
   (2) the plurality of sub-OTAs further include: a third sub-OTA, wherein a third transconductance output current generated by the third sub-OTA is coupled through the another cascading capacitor to generate the another transient bias current on the another common mode bias node of the first sub-OTA.

11. The parallel input and dynamic cascaded OTA of claim 10, wherein the first sub-OTA further includes a current source circuit, which is coupled to the differential pair circuit of the first sub-OTA, wherein the common mode bias node is to a coupling node between the current source circuit and the differential pair circuit, whereas, the another common mode bias node is to a cascaded node of the current source circuit, wherein the current source circuit is configured as a cascaded current source circuit.

12. The parallel input and dynamic cascaded OTA of claim 1, wherein the first sub-OTA is further configured to operably receive another transient bias current on the common mode bias node of the first sub-OTA via another cascading capacitor, thus providing the another transient bias current to the differential pair circuit of the first sub-OTA in a case when a transient state occurs in the differential input voltage corresponding to the first sub-OTA, so that the loop bandwidth and the response speed during the transient state are enhanced and during the steady state, the another transient bias current is reduced, so as to enhance stability through reducing the loop bandwidth; wherein the another transient bias current is generated according to one of the following configurations:
   (1) the second sub-OTA is further configured to operably generate the another transient bias current; or
   (2) the plurality of sub-OTAs further include: a third sub-OTA, wherein a third transconductance output current generated by the third sub-OTA is coupled through the another cascading capacitor to generate the another transient bias current on the common mode bias node of the first sub-OTA.

13. The parallel input and dynamic cascaded OTA of claim 1, wherein the first sub-OTA further includes a current source circuit, which is coupled to the differential pair circuit of the first sub-OTA, wherein the common mode bias node is a coupling node between the current source circuit and the differential pair circuit, whereas, the first sub-OTA further includes another common mode bias node which is a cascaded node of the current source circuit, wherein the current source circuit is configured as a cascaded current source circuit;
   wherein the first sub-OTA is configured to operably receive another transient bias current on the another common mode bias node of the first sub-OTA via another cascading capacitor, thus providing the another transient bias current to the differential pair circuit of the first sub-OTA in a case when a transient state occurs in the differential input voltage corresponding to the first sub-OTA, so that the loop bandwidth and the response speed during the transient state are enhanced and during the steady state, the another transient bias current is reduced, so as to enhance stability through reducing the loop bandwidth; wherein the another transient bias current is generated according to one of the following configurations:
(1) the second sub-OTA is further configured to operably generate the another transient bias current; or
(2) the plurality of sub-OTAs further include: a third sub-OTA, wherein a third transconductance output current generated by the third sub-OTA is coupled through the another cascading capacitor to generate the another transient bias current on the another common mode bias node of the first sub-OTA.

14. A regulator circuit, comprising: a parallel input and dynamic cascaded OTA including: a plurality of sub-OTAs, wherein each sub-OTA is configured to operably generate a corresponding transconductance output current according to a differential input voltage which is linearly coupled to the plurality of sub-OTAs, wherein the plurality of sub-OTAs include a first sub-OTA and a second sub-OTA; and at least one cascading capacitor, which is cascaded between the first sub-OTA and the second sub-OTA, wherein the at least one cascading capacitor includes a first cascading capacitor, which is cascaded between the first sub-OTA and the second sub-OTA; wherein a second transconductance output current generated by the second sub-OTA is coupled through the first cascading capacitor to generate an AC coupled (coupled in an alternating current manner) transient bias current on a common mode bias node of the first sub-OTA, thus providing the AC coupled transient bias current to a differential pair circuit of the first sub-OTA in a case when a transient state occurs in the differential input voltage corresponding to the first sub-OTA, wherein the non-inverting transconductance current and the inverting transconductance current of the differential pair circuit during the transient state have a phase difference which is sufficiently large that an transconductance output current of the differential pair circuit is enhanced to an extent, so that a loop bandwidth and a response speed during the transient state are enhanced, and during a steady state, the AC coupled transient bias current is reduced, so as to enhance stability through reducing the loop bandwidth; an output transistor; and a feedback circuit; wherein one input end of a pair of differential input ends of the first sub-OTA is coupled to a first reference signal, whereas, the other input end of the pair of differential input ends of the first sub-OTA is configured to operably receive a feedback signal, so as to regulate an output signal to a target value, wherein the target value is correlated with the first reference signal; and wherein the second sub-OTA is configured as one of the following: wherein one input end of a pair of differential input ends of the second sub-OTA is coupled to a second reference signal, whereas, the other input end of the pair of differential input ends of the second sub-OTA is configured to operably receive the feedback signal; wherein a ratio of the second reference signal to the first reference signal is correlated with a feedback gain of the feedback circuit; or wherein a pair of differential input ends of the second sub-OTA is coupled in parallel to the pair of differential input ends of the first sub-OTA.

15. The regulator circuit of claim 14, wherein a transconductance coefficient of the second sub-OTA is greater than a transconductance coefficient of the first sub-OTA, such that the phase difference between the non-inverting transconductance current and the inverting transconductance current during the transient state is sufficiently large.

16. The regulator circuit of claim 14, wherein the parallel input and dynamic cascaded OTA further includes:
a direct current (DC) bias voltage load, which is coupled to an output end of the second sub-OTA and which is coupled to the first cascading capacitor, wherein the DC bias voltage load is configured to operably receive the second transconductance output current, so as to provide a corresponding DC bias voltage at the output end of the second sub-OTA.

17. The regulator circuit of claim 16, wherein the DC bias voltage load includes a metal oxide semiconductor (MOS) diode.

18. The regulator circuit of claim 16, wherein each sub-OTA is configured as an OTA having a pair of differential input ends and a single output end, wherein an impedance of the DC bias voltage load corresponding to the second sub-OTA is large to an extent such that the first cascading capacitor generates a pole having a sufficiently low frequency at the common mode bias node of the first sub-OTA, thus causing the phase difference large to an extent that the transconductance output current is enhanced during the transient state, and/or that a unit gain bandwidth, the parallel input and dynamic cascaded OTA has a phase margin greater than or equal to 45 degree.

* * * * *